United States Patent
Kozuma et al.

(10) Patent No.: US 12,190,079 B2
(45) Date of Patent: *Jan. 7, 2025

(54) SEMICONDUCTOR DEVICE COMPRISING OPERATION CIRCUITS AND A SWITCH CIRCUIT

(71) Applicant: Semiconductor Energy Laboratory Co., Ltd., Atsugi (JP)

(72) Inventors: Munehiro Kozuma, Atsugi (JP); Takeshi Aoki, Atsugi (JP); Seiichi Yoneda, Isehara (JP); Yoshiyuki Kurokawa, Sagamihara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 250 days.

This patent is subject to a terminal disclaimer.

(21) Appl. No.: 17/716,239

(22) Filed: Apr. 8, 2022

(65) Prior Publication Data
US 2022/0276838 A1    Sep. 1, 2022

Related U.S. Application Data

(63) Continuation of application No. 16/609,902, filed as application No. PCT/IB2018/053139 on May 7, 2018, now Pat. No. 11,314,484.

(30) Foreign Application Priority Data

May 19, 2017  (JP) .................. 2017-099514
Jul. 7, 2017   (JP) .................. 2017-133264

(51) Int. Cl.
*G06F 7/544*    (2006.01)
*G06N 3/063*    (2023.01)

(52) U.S. Cl.
CPC ........... *G06F 7/5443* (2013.01); *G06N 3/063* (2013.01)

(58) Field of Classification Search
CPC .................................................. G06F 7/5443
See application file for complete search history.

(56) References Cited

U.S. PATENT DOCUMENTS 5,444,822 A * 8/1995 Shinohara ............. G06N 3/063
                                                    706/41
5,550,993 A    8/1996 Ehlig et al.
(Continued)

FOREIGN PATENT DOCUMENTS

CN    102693207 A    9/2012
JP    07-006146 A    1/1995
(Continued)

OTHER PUBLICATIONS

International Search Report (Application No. PCT/IB2018/053139) Dated Aug. 14, 2018.
(Continued)

*Primary Examiner* — Michael D. Yaary
(74) *Attorney, Agent, or Firm* — Eric J. Robinson; Robinson Intellectual Property Law Office, P.C.

(57) ABSTRACT

A semiconductor device having a novel structure is provided. The semiconductor device includes a plurality of operation circuits that can switch different kinds of operation processing; a plurality of switch circuits that can switch a connection state between the operation circuits; and a controller. The operation circuit includes a first memory that stores data corresponding to a weight parameter used in the plurality of kinds of operation processing. The operation circuit executes a product-sum operation by switching weight data in accordance with a context. The switch circuit includes a second memory that stores data for switching a plurality of connection states in response to switching of a second context signal. The controller generates a second context signal on the basis of a first context signal. The (Continued)

amount of data stored in the second memory can be smaller than the amount of data stored in the first memory in the operation circuit.

6 Claims, 17 Drawing Sheets

(56) References Cited

U.S. PATENT DOCUMENTS

| | | | |
|---|---|---|---|
| 5,627,944 | A | 5/1997 | Fujimoto et al. |
| 9,065,438 | B2 | 6/2015 | Aoki et al. |
| 9,116,751 | B2 | 8/2015 | Yachide |
| 9,384,813 | B2 | 7/2016 | Aoki et al. |
| 9,461,646 | B2 | 10/2016 | Kozuma et al. |
| 9,954,531 | B2 | 4/2018 | Ikeda et al. |
| 9,978,014 | B2 * | 5/2018 | Lupon .................... G06N 3/045 |
| 10,019,348 | B2 | 7/2018 | Tsutsui |
| 10,141,069 | B2 | 11/2018 | Ikeda et al. |
| 10,445,227 | B2 | 10/2019 | Tsutsui |
| 11,314,484 | B2 * | 4/2022 | Kozuma .................... G06F 7/60 |
| 2012/0204181 | A1 | 8/2012 | Yachide |
| 2015/0228324 | A1 | 8/2015 | Aoki et al. |
| 2016/0261272 | A1 | 9/2016 | Ikeda et al. |
| 2018/0285727 | A1 * | 10/2018 | Baum .................... G06N 3/063 |
| 2019/0164620 | A1 | 5/2019 | Ikeda et al. |
| 2020/0176069 | A1 | 6/2020 | Ikeda et al. |

FOREIGN PATENT DOCUMENTS

| | | |
|---|---|---|
| JP | 2012-185803 A | 9/2012 |
| JP | 2015-165655 A | 9/2015 |
| JP | 2016-105595 A | 6/2016 |
| JP | 2016-119091 A | 6/2016 |
| JP | 2016-167808 A | 9/2016 |
| JP | 2016-219011 A | 12/2016 |

OTHER PUBLICATIONS

Written Opinion (Application No. PCT/IB2018/053139) Dated Aug. 14, 2018.

Waidyasooriya. H et al., "Implementation of a Partially Reconfigurable Multi-Context FPGA Based on Asynchronous Architecture", IEICE Trans. Electron. (IEICE Transactions on Electronics), Apr. 1, 2009, vol. E92-C, No. 4, pp. 539-549.

* cited by examiner

Connection structure: C0
Weight data: W0

Connection structure: C0
Weight data: W1

Connection structure: C0
Weight data: W2

Connection structure: C0
Weight data: W3

Connection structure: C1
Weight data: W0

SEMICONDUCTOR DEVICE COMPRISING OPERATION CIRCUITS AND A SWITCH CIRCUIT

TECHNICAL FIELD

One embodiment of the present invention relates to a semiconductor device. In particular, one embodiment of the present invention relates to a semiconductor device having a function of performing product-sum operation processing.

BACKGROUND ART

A semiconductor device such as a multi-context FPGA (Field Programmable Gate Array) in which a routing switch and a programmable operation circuit where configuration data corresponding to a plurality of circuit structures is stored in a memory are combined has been proposed (for example, Non-Patent Document 1). The multi-context method is a method in which the circuit structure of an FPGA is changed by changing configuration data to be used. Configuration data representing circuit structure data is referred to as context.

The multi-context method is a method by which the circuit structure can be changed by selecting a context corresponding to one from a plurality of sets (memory sets) of configuration data stored in a memory in advance.

REFERENCE

Non-Patent Document

[Non-Patent Document 1] H. M. Waidyasooriya et al., "Implementation of a Partially Reconfigurable Multi-Context FPGA Based on Asynchronous Architecture," IEICE TRANSACTIONS on Electronics, Vol. E92-C, pp. 539-549, 2009

SUMMARY OF THE INVENTION

Problems to be Solved by the Invention

However, as the number of contexts is increased, an increase in a mount area of a circuit becomes a problem because memory sets corresponding to the contexts are needed. Furthermore, in the case where only part of data in the circuit is desired to be changed, all data sets need to be updated in context switching, and thus there is a problem in that the circuit performance is decreased as the circuit size is increased.

An object of one embodiment of the present invention is to provide a semiconductor device having a novel structure. Another object of one embodiment of the present invention is to provide a novel semiconductor device that can inhibit an increase in the circuit size.

Note that the descriptions of these objects do not disturb the existence of other objects. One embodiment of the present invention does not need to achieve all the objects. Other objects will be apparent from and can be derived from the description of the specification, the drawings, the claims, and the like.

Means for Solving the Problems

One embodiment of the present invention is a semiconductor device including a product-sum operation circuit including a plurality of operation circuits and a plurality of switch circuits; and a controller. The operation circuit includes a multiplier circuit, an adder circuit, and a first memory. The first memory has a function of storing first data output to the multiplier circuit in response to switching of a first context signal. The switch circuit includes a second memory and a switch that switches a connection state between the operation circuits. The second memory has a function of storing second data that switches a connection state of the switch in response to switching of a second context signal. The controller has a function of generating the first context signal and the second context signal on the basis of a third context signal. The number of second contexts switched on the basis of the second context signal is smaller than the number of first contexts switched on the basis of the first context signal.

In the semiconductor device of one embodiment of the present invention, the first data is preferably data corresponding to a weight parameter in a neural network.

In the semiconductor device of one embodiment of the present invention, the controller includes a first decoder and a lookup table; the controller has a function of outputting the third context signal as the first context signal; and the first decoder has a function of outputting the second context signal with reference to data stored in the lookup table in response to an external signal.

In the semiconductor device of one embodiment of the present invention, the external signal is preferably a serial bus signal.

In one embodiment of the present invention, the operation circuit includes a second decoder; the switch circuit includes a third decoder; the first memory includes a switch that switches the first context; the second memory includes a switch that switches the second context; the second decoder has a function of generating a first switching signal on the basis of the first context signal; the third decoder has a function of generating a second switching signal on the basis of the second context signal; the first switching signal is a signal that controls a conduction state of the switch that switches the first context; and the second switching signal is a signal that controls a conduction state of the switch that switches the second context.

In the semiconductor device of one embodiment of the present invention, the operation circuit preferably further includes a first register; the first register has a function of holding input data; the multiplier circuit has a function of outputting multiplication data corresponding to a product of the first data and the input data; and the adder circuit has a function of outputting addition data corresponding to the sum of the multiplication data and an operation result output from a different operation circuit electrically connected by switching of the switch circuit.

In the semiconductor device of one embodiment of the present invention, it is preferable that each of the first memory and the second memory include a transistor, and that the transistor be a transistor including an oxide semiconductor in a channel formation region.

Note that other embodiments of the present invention will be shown in the following embodiments and the drawings.

Effect of the Invention

One embodiment of the present invention can provide a semiconductor device having a novel structure. Alternatively, one embodiment of the present invention can provide a novel semiconductor device that can inhibit an increase in the circuit size.

Note that the descriptions of the effects do not disturb the existence of other effects. One embodiment of the present invention does not necessarily achieve all the effects. Other effects will be apparent from and can be derived from the description of the specification, the drawings, the claims, and the like.

MODE FOR CARRYING OUT THE INVENTION

Figure 1:
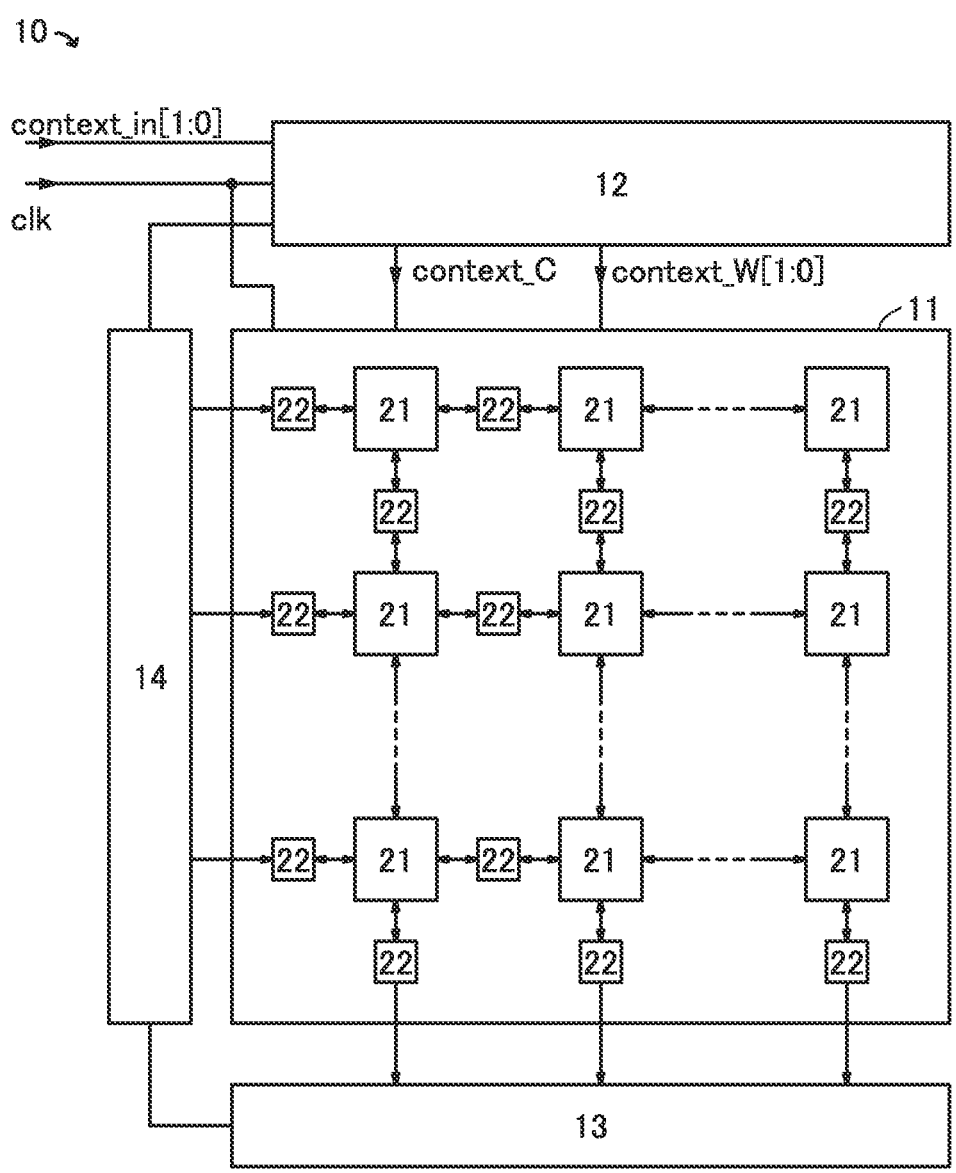
FIG. 1A block diagram for describing a semiconductor device.

Hereinafter, embodiments will be described with reference to drawings. However, the embodiments can be implemented with many different modes, and it will be readily appreciated by those skilled in the art that modes and details thereof can be changed in various ways without departing from the spirit and scope thereof. Thus, the present invention should not be interpreted as being limited to the following description of the embodiments.

In this specification and the like, ordinal numbers such as first, second, and third are used in order to avoid confusion among components. Thus, the terms do not limit the number of components. In addition, the terms do not limit the order of components. For example, a "first" component in one embodiment in this specification and the like can be referred to as a "second" component in other embodiments or claims. Furthermore, for example, a "first" component in one embodiment in this specification and the like can be omitted in other embodiments or claims.

In the drawings, the same elements, elements having similar functions, elements formed of the same material, elements formed at the same time, or the like are sometimes denoted by the same reference numerals, and description thereof is not repeated in some cases.

<Structure of Semiconductor Device>

A structure of a semiconductor device of one embodiment of the present invention is described.

FIG. 1 is a block diagram of a semiconductor device 10. The semiconductor device 10 includes a product-sum operation circuit 11, a controller 12, a data processing circuit 13, and an SRAM 14.

The product-sum operation circuit 11 includes a plurality of operation circuits 21 and a plurality of switch circuits 22. Note that the product-sum operation circuit is a circuit that performs a product-sum operation. A product-sum operation is an operation in which data obtained by multiplication are added. The product-sum operation circuit 11 can perform a preset operation without being limited to a product-sum operation. Accordingly, the product-sum operation circuit 11 may be referred to as a programmable circuit.

The operation circuit 21 included in the product-sum operation circuit 11 is what is called a programmable operation circuit whose function can be changed to a function set by control by a context signal. The operation circuit 21 includes a multiplier circuit, an adder circuit, and a memory circuit. The multiplier circuit is a circuit that outputs multiplication data corresponding to a product of input data and data stored in the memory circuit. The adder circuit is a circuit that outputs addition data corresponding to the sum of data corresponding to an operation result input from a different operation circuit and the multiplication data. The data corresponding to the operation result input from the different operation circuit is addition data in the different operation circuit. The memory circuit is a circuit that stores data (weight data) corresponding to a weight parameter in a neural network. This data has high resistance to noise when being a digital signal, and switching of the weight data can be performed at high speed. The operation circuit 21 can perform product-sum operations using different weight parameters by switching the weight data in response to switching of the context signal. A context signal that is input to the product-sum operation circuit 11 and switches the function of the operation circuit 21 is referred to as a context signal context_W.

The product-sum operation circuit 11 is a circuit that performs a product-sum operation using a convolutional neural network, for example. By performing a produce-sum operation using different weight parameters in response to switching of a context and using a different connection state in response to the switching of the context, product-sum operations in different layers of a fully connected layer, a convolution layer, and the like can be performed. Input data input to the product-sum operation circuit 11 is, for example, image data.

The switch circuit 22 included in the product-sum operation circuit 11 is what is called a programmable switch circuit whose function can be switched to a function set by control by a context signal. The switch circuit 22 is provided between the operation circuits 21. The switch circuit 22 includes a transistor functioning as a switch and a memory circuit. The switch included in the switch circuit 22 has a function of switching a connection state between the operation circuits 21. The memory circuit included in the switch circuit 22 is a circuit that stores data for switching the connection state of the switch. The switch circuit 22 allows data obtained in the operation circuit 21 to be input to/output from a predetermined circuit by switching the connection state of the switch in response to switching of the context signal. A context signal that is input to the product-sum operation circuit 11 and switches the function of the switch circuit 22 is referred to as a context signal context_C.

The controller 12 is a circuit having a function of generating the context signal context_C and the context signal context_W on the basis of a context signal input from the outside. A context signal input to the controller 12 is referred to as a context signal context_in. In addition to the context signal context_in, a clock signal clk is input to the controller 12.

The controller 12 performs output so that on the basis of the context signal context_in, the number of contexts switched on the basis of the context signal context_C becomes smaller than the number of contexts switched on the basis of the context signal context_W For example, in FIG. 1, the context signal context_in is a 2-bit signal and denoted by context_in[1:0]. The context signal context_in [1:0] means a combination of a context signal context_in[0] and a context signal context_in[1].

In the example of FIG. 1, like the context signal context_in, the context signal context_W is denoted by context_W [1:0]. The context signal context_W[1:0] is a 2-bit signal and can switch four contexts. In the example of FIG. 1, the context signal context_C is denoted by context_C. In the example of FIG. 1, the context signal context_C is denoted by context_C. The context signal context_C is a 1-bit signal and can switch two contexts. Note that the numbers of contexts based on the context signal context_W and the context signal context_C are just examples, and as described above, the number of contexts switched on the basis of the context signal context_C is only required to be smaller than the number of contexts switched on the basis of the context signal context_W.

The data processing circuit 13 is a circuit that performs, on the data obtained in the product-sum operation circuit 11, operation processing different from a product-sum operation. Examples of operation processing performed by the data processing circuit 13 include operation processing with a rectified linear unit (hereinafter, ReLU), which is an activation function, and pooling operation processing. As the activation function, besides ReLU, a sigmoid function, a hyperbolic tangent (tanh) function, or a step function can be used, for example.

The SRAM (Static Random Access Memory) 14 is a circuit having a function of holding data necessary for an operation in the product-sum operation circuit 11. The SRAM 14 is referred to as a data holding circuit in some cases. The timing of input or output of held data to/from the SRAM 14 is determined by control by the controller 12.

FIGS. 2(A) to 2(E) are block diagrams for describing operation of the operation circuit 21 and the switch circuit 22 for performing product-sum operation processing in the product-sum operation circuit 11. The operation circuit 21 is a circuit capable of switching weight data used for multiplication processing in response to the context signal context_W, and the switch circuit 22 is a circuit capable of switching a connection between the operation circuits 21 in response to the context signal context_C.

The operation circuit 21 includes a register circuit that holds input data and a memory circuit that stores weight data. Input data $I_{ll}$ and weight data Ware input to and held in the operation circuit 21 in FIG. 2(A). The input data $I_{ll}$ is held in the register in the operation circuit 21. The weight data W includes a plurality of weight data (e.g., four weight data, W0, W1, W2, and W3) and is stored in the memory circuit in the operation circuit 21.

Figure 2A:
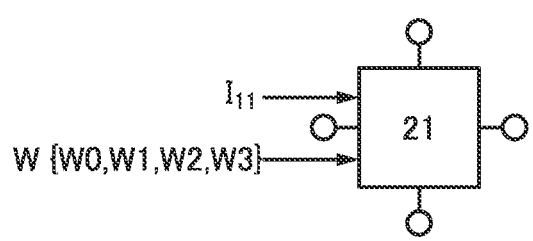
FIGS. 2A-2E Block diagrams for describing a semiconductor device.
Figure 2B:
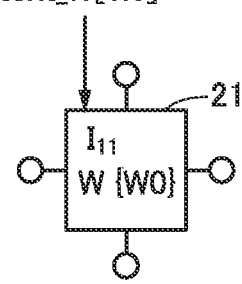

The operation circuit 21 includes a decoder that decodes the context signal context_W and generates a switching signal for selecting weight data. FIG. 2(B) shows the context signal context_W[1:0] input to the operation circuit 21. The context signal context_W[1:0] is decoded by the decoder included in the operation circuit 21. FIG. 2(B) shows a state where the weight data W0 is selected from the four weight data W by a switching signal obtained by decoding the context signal context_W[1:0].

Figure 2C:
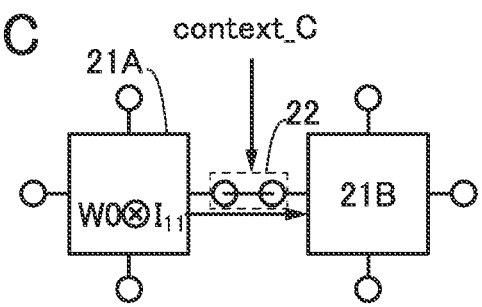

FIG. 2(C) shows operation of outputting, to an operation circuit 21B, data obtained by multiplication of the input data hi held in an operation circuit 21A and the selected weight data W0 (represented by W0×$I_{ll}$ in the diagram). In the operation circuit 21A, a switching circuit therein is switched to output the obtained multiplication data.

The switch circuit 22 includes a decoder that decodes the context signal context_C and generates a switching signal for switching a conduction state of the switch. FIG. 2(C) shows the context signal context_C input to the switch circuit 22. The context signal context_C is decoded by the decoder included in the switch circuit 22. By the switching signal obtained by the decoding, between which of the plurality of the operation circuits an electrical connection is made is selected. FIG. 2(C) shows a state in which the switch circuit 22 between the operation circuit 21A and the operation circuit 21B is brought into a conduction state.

Figure 2E:
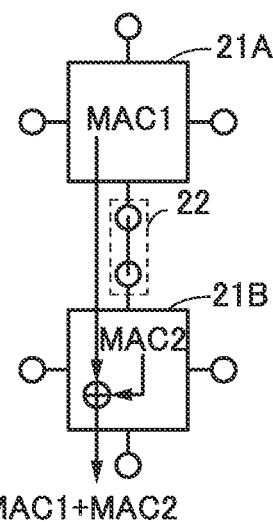
Figure 2D:
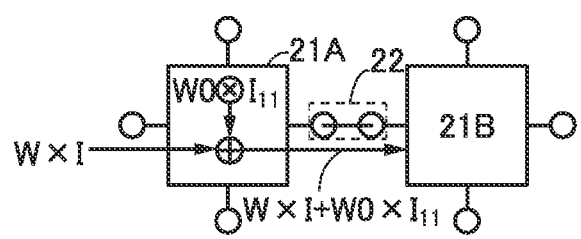

FIG. 2(D) shows operation in which product-sum operation data (represented by W×I+W0×$I_{ll}$ the diagram; referred to as MAC) that is the sum of the multiplication data obtained in the operation circuit 21A and data (W×I) output from a different operation circuit is output to the operation circuit 21B. In the operation circuit 21A, the switching circuit therein is switched to output the sum of the obtained multiplication data and the data output from the different operation circuit. FIG. 2(D) shows a state different from the state of the output of the multiplication data in FIG. 2(C) because of the switching circuit.

FIG. 2(E) shows operation in which product-sum operation data held in the operation circuit 21A (MAC1 in the diagram) is output to the operation circuit 21B, and product-sum operation data (MAC1+MAC2 in the diagram) obtained by adding it and product-sum operation data held in the operation circuit 21A (MAC2 in the diagram) is output. In the operation circuit 21A, the switching circuit therein is switched to output the sum of the held product-sum operation data and product-sum operation data output from a different operation circuit. The switch circuit 22 between the operation circuit 21A and the operation circuit 21B is brought into a conduction state by a switching signal obtained by decoding the context signal context_C. FIG. 2(E) shows a state in which the switch circuit 22 between the operation circuit 21A and the operation circuit 21B is brought into a conduction state.

As described with reference to FIGS. 2(A) to 2(E), the operation circuit 21 and the switch circuit 22 can switch weight data used for operation processing, data output by operation processing, and the connection between the operation circuits 21, in response to switching signals obtained by decoding the context signal context_W and the context signal context_C. Note that specific circuit examples of the operation circuit 21 and the switch circuit 22 are described later.

Here, an operation model in which product-sum operation processing is performed by switching of the weight data and switching of operation processing such as output of multiplication data or output of addition data shown in FIGS. 2(A) to 2(E) is described with reference to FIGS. 3(A) to 3(F).

In the description of FIGS. 3(A) to 3(F), the case of performing the product-sum operation of filters ($W_{11}$, $W_{12}$, $W_{13}$, $W_{14}$), ($W_{21}$, $W_{22}$, $W_{23}$, $W_{24}$), ($W_{31}$, $W_{32}$, $W_{33}$, $W_{34}$), and ($W_{41}$, $W_{42}$, $W_{43}$, $W_{44}$) having four different types of weight data and input data ($I_1$, $I_2$, $I_3$, $I_4$) is described. By using the above method for the product-sum operation processing described with reference to FIG. 2, product-sum operations can proceed in parallel while data obtained by a plurality of operation circuits are looped.

A product-sum operation with a plurality of filters (a convolutional operation) can be expressed by a matrix-vector product as shown in Formula (1).

$$\begin{pmatrix} Y_1 \\ Y_2 \\ Y_3 \\ Y_4 \end{pmatrix} = \begin{pmatrix} W_{11} & W_{12} & W_{13} & W_{14} \\ W_{21} & W_{22} & W_{23} & W_{24} \\ W_{31} & W_{23} & W_{33} & W_{34} \\ W_{41} & W_{24} & W_{43} & W_{44} \end{pmatrix} \begin{pmatrix} I_1 \\ I_2 \\ I_3 \\ I_4 \end{pmatrix} \quad (1)$$

A 4×4 matrix that consists of W corresponds to weight data (elements of one row correspond to components of one filter). A 1×4 matrix that is composed of I corresponds to input data. A 1×4 matrix that is composed of Y ($Y_1$ to $Y_4$) corresponds to data obtained by a product-sum operation.

Figure 3A:
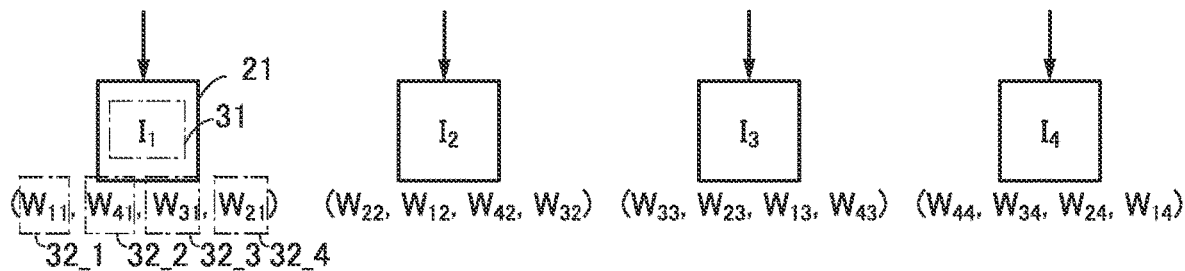
FIGS. 3A-3F Block diagrams for describing a semiconductor device.

When applied to an operation model for performing a product-sum operation using the above-described operation circuit 21, the matrix-vector product of Formula (1) can be shown as in FIG. 3(A). That is, the input data $I_1$ to $I_4$ are held as input data 31 of respective operation circuits 21. Furthermore, the data (weight data) corresponding to the weight parameters of the filters ($W_{11}$, $W_{12}$, $W_{13}$, $W_{14}$), ($W_{21}$, $W_{22}$, $W_{23}$, $W_{24}$), ($W_{31}$, $W_{32}$, $W_{33}$, $W_{34}$), and ($W_{41}$, $W_{42}$, $W_{43}$, $W_{44}$) can be written to the memory circuits in the respective operation circuits 21, and the multiplication data can be generated using one of different weight data 32_1 to 32_4 in response to a switching signal obtained by decoding by the context signal context_W Hereinafter, the description is made assuming that the operation processing progresses every clock (1 clk).

Figure 3B:
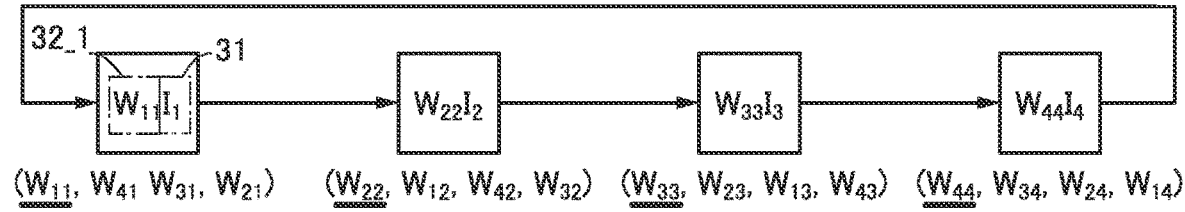

After 1 clk after input data is written to the operation circuit 21, given weight data from a set of weight parameters is set by a switching signal obtained by decoding the context signal context_W. Specifically, the weight data ($W_{11}$, $W_{22}$, $W_{33}$, $W_{44}$) that are underlined in FIG. 3(B) are set, and the operation circuits 21 generate multiplication data with the held input data ($I_1$, $I_2$, $I_3$, $I_4$). The operation circuits 21 generate multiplication data ($W_{11} \cdot I_1$, $W_{22} \cdot I_2$, $W_{33} \cdot I_3$, $W_{44} \cdot I_4$) of the input data 31 and the weight data 32_1.

Figure 3C:
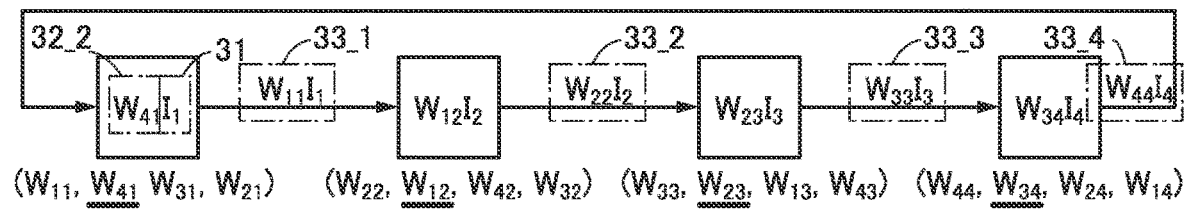

Next, in FIG. 3(C) after 1 clk from the state of FIG. 3(B), weight data different from those in FIG. 3(B) are set by a switching signal obtained by decoding the context signal context_W. Specifically, the weight data ($W_{41}$, $W_{12}$, $W_{23}$, $W_{34}$) that are underlined in FIG. 3(C) are set, and the operation circuits 21 generate multiplication data with the held input data ($I_1$, $I_2$, $I_3$, $I_4$). The operation circuits 21 generate multiplication data ($W_{41} \cdot I_1$, $W_{12} \cdot I_2$, $W_{23} \cdot I_3$, $W_{34} \cdot I_4$) of the input data 31 and the weight data 32_2. Furthermore, the operation circuits 21 output, to the operation circuits 21 in the next columns, data 33_1 to 33_4 ($W_{11} \cdot I_1$, $W_{22} \cdot I_2$, $W_{33} \cdot I_3$, $W_{44} \cdot I_4$), which are generated in the state of FIG. 3(C), as next-column addition data.

Figure 3D:
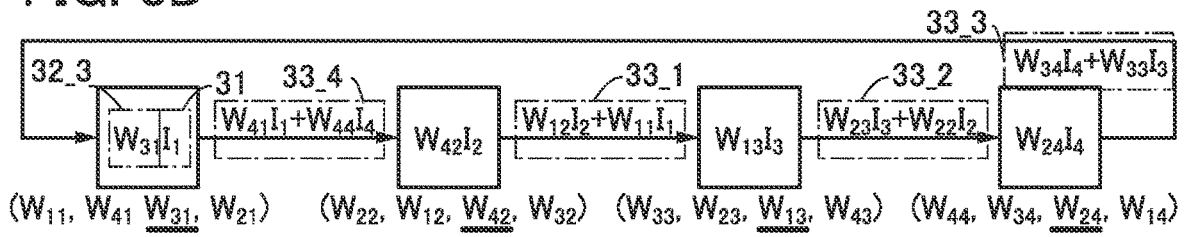

Next, in FIG. 3(D) after 1 clk from the state of FIG. 3(C), weight data different from those in FIG. 3(C) are set by a switching signal obtained by decoding the context signal context_W. Specifically, the weight data ($W_{31}$, $W_{42}$, $W_{13}$, $W_{24}$) that are underlined in FIG. 3(D) are set, and the operation circuits 21 generate multiplication data with the held input data ($I_1$, $I_2$, $I_3$, $I_4$). For example, the operation circuits 21 generate multiplication data ($W_{31} \cdot I_1$, $W_{42} \cdot I_2$, $W_{13} \cdot I_3$, $W_{24} \cdot I_4$) of the input data 31 and the weight data 32_3. Furthermore, the operation circuits 21 output, to the operation circuits 21 in the next columns, the data 33_1 to 33_4 ($W_{12} \cdot I_2 + W_{11} \cdot I_1$, $W_{23} \cdot I_3 + W_{22} \cdot I_2$, $W_{34} \cdot I_4 + W_{33} \cdot I_3$, $W_{41} \cdot I_1 + W_{44} \cdot I_4$) obtained by adding the multiplication data ($W_{41} \cdot I_1$, $W_{12} \cdot I_2$, $W_{23} \cdot I_3$, $W_{34} \cdot I_4$) to the addition data ($W_{11} \cdot I_1$, $W_{22} \cdot I_2$, $W_{33} \cdot I_3$, $W_{44} \cdot I_4$), which are output in FIG. 3(C), as next-column addition data (also referred to as product-sum operation data).

Figure 3E:
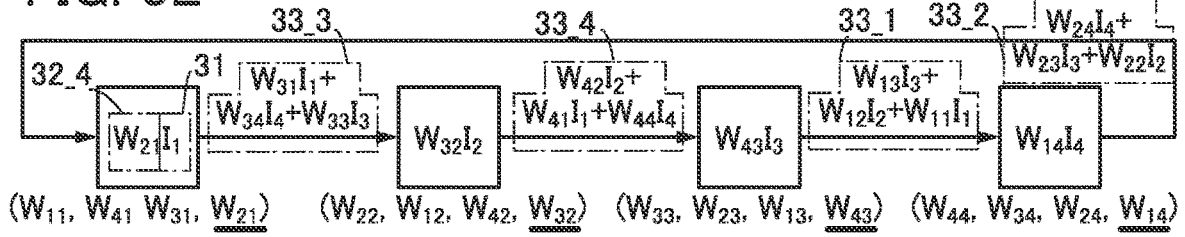

Next, in FIG. 3(E) after 1 clk from the state of FIG. 3(D), weight data different from those in FIG. 3(D) are set by a switching signal obtained by decoding the context signal context_W. Specifically, the weight data ($W_{21}$, $W_{32}$, $W_{43}$, $W_{14}$) that are underlined in FIG. 3(E) are set, and the operation circuits 21 generate multiplication data with the held input data ($I_1$, $I_2$, $I_3$, $I_4$). For example, the operation circuits 21 generate multiplication data ($W_{21} \cdot I_1$, $W_{32} \cdot I_2$, $W_{43} \cdot I_3$, $W_{14} \cdot I_4$) of the input data 31 and the weight data 32_4. Furthermore, the operation circuits 21 output, to the operation circuits 21 in the next columns, the data 33_1 to 33_4 ($W_{13} \cdot I_3 + W_{12} \cdot I_2 + W_{11} \cdot I_1$, $W_{24} \cdot I_4 + W_{23} \cdot I_3 + W_{22} \cdot I_2$, $W_{31} \cdot I_1 \pm W_{34} \cdot I_4 + W_{33} \cdot I_3$, $W_{42} \cdot I_2 + W_{41/1} \pm W_{44} \cdot I_4$) obtained by adding the multiplication data ($W_{31} \cdot I_1$, $W_{42} \cdot I_2$, $W_{13}$—$I_3$, $W_{24} \cdot I_4$) to the addition data ($W_{12} \cdot I_2 + W_{11} \cdot I_1$, $W_{23} \cdot I_3 + W_{22} \cdot I_2$, $W_{34} \cdot I_4 + W_{33} \cdot I_3$, $W_{41} \cdot I_1 + W_{44} \cdot I_4$), which are output in FIG. 3(D), as next-column addition data.

Figure 3F:
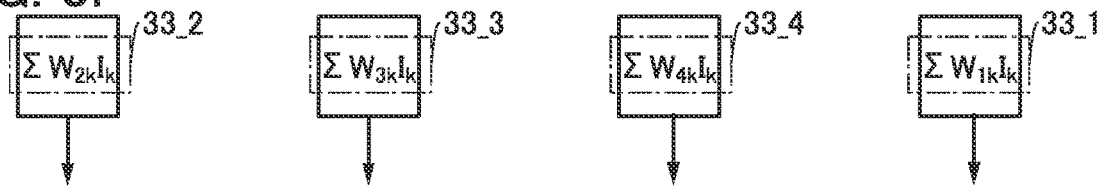

Next, in FIG. 3(F) after 1 clk from the state in FIG. 3(E), the operation circuits 21 obtain data obtained by adding the multiplication data ($W_{21} \cdot I_1$, $W_{32} \cdot I_2$, $W_{43} \cdot I_3$, $W_{14} \cdot I_4$) to the addition data ($W_{13} \cdot I_3 + W_{12} \cdot I_2 + W_{11} \cdot I_1$, $W_{24} \cdot I_4 + W_{23} \cdot I_3 + W_{22} \cdot I_2$, $W_{31} \cdot I_1 \pm W_{34} \cdot I_4 + W_{33} \cdot I_3$, $W_{42} \cdot I_2 + W_{41} \cdot I_1 \pm W_{44} \cdot I_4$), which are output in FIG. 3(E). As shown in FIG. 3(F), the respective operation circuits 21 can obtain product-sum operation data such as data 33_2 ($W_{21} \cdot I_1 + W_{24} \cdot I_4 + W_{23} \cdot I_3 + W_{22} \cdot I_2$), data 33_3 ($W_{32} \cdot I_2 + W_{31} \cdot I_1 + W_{34} \cdot I_4 + W_{33} \cdot I_3$), data 33_4 ($W_{43} \cdot I_3 + W_{42} \cdot I_2 + W_{41} \cdot I_1 + W_{44} \cdot I_4$), and data 33_1 ($W_{14} \cdot I_4 + W_{13} \cdot I_3 + W_{12} \cdot I_2 + W_{11} \cdot I_1$). The obtained data correspond to Y ($Y_1$ to $Y_4$) expressed by the matrix-vector product.

Data obtained by using the operation model of FIGS. 3(A) to 3(F) are shifted in succession, whereby an enormous number of product-sum operations can be efficiently performed. The product-sum operation circuit 11 included in the semiconductor device 10 can execute product-sum operations by concurrently processing multiplication data and addition data between the operation circuits 21 as in pipeline processing in a processor, and by shifting the multiplication data and the addition data between the plurality of operation circuits 21. Accordingly, when operation processing with product-sum operations is performed by limited hardware, massively parallel data processing can be efficiently performed with limited circuit resources.

With the architecture in FIGS. 3(A) to 3(F), data access to an external memory is unnecessary during an operation, and product-sum operation data can be efficiently obtained while data are transmitted in parallel between all the operation circuits 21. Therefore, a problem of the increase in circuit size in a neural network, accompanied by the increase in input data, weight data, and the like, can be solved.

In the case where the operation model in which product-sum operation processing described with reference to FIGS.

3(A) to 3(F) is performed is applied to the semiconductor device 10 in FIG. 1, the operation model can be achieved by switching weight data used for operation processing, data output by operation processing, or a connection between the operation circuits 21 in response to the context signal context_W and the context signal context_C as described with reference to FIGS. 2(A) to 2(E).

Specifically, in the case where the operation model shown in FIGS. 3(A) to 3(F) is achieved, the operation model can be achieved when the number of contexts for switching weight data for product-sum operation processing is four, that is, when a data set of the weight data W0, the weight data W1, the weight data W2, and the weight data W3 is used in switching of weight data. Furthermore, in the case of addition processing as shown in FIG. 2(E), in which the product-sum operation data obtained by the operation model shown in FIGS. 3(A) to 3(F) are added to each other, weight data is not necessary; however, the addition processing can be achieved by a data set of one of the weight data W0 to W3. In that case, the context signal context_W may be decoded to obtain switching signals context_W0 to context_W3 for switching contexts.

In the case where the operation model shown in FIGS. 3(A) to 3(F) is achieved, the operation model can be achieved when the number of contexts in the connection structure is one, that is, the connection structure can be achieved by a switching signal context_C0. Furthermore, in the case where the product-sum operation data obtained by the operation model shown in FIGS. 3(A) to 3(F) are added to each other as shown in FIG. 2(E), the addition processing can be achieved when the number of contexts in the connection structure is one, that is, the connection structure can be achieved by a switching signal context_C1. In that case, the context signal context_C may be decoded to obtain the switching signals context_C0 and context_C1 for switching contexts.

The above structure can be described with reference to block diagrams illustrated in FIGS. 4(A) to 4(E). In FIGS. 4(A) to 4(E), in addition to the operation circuit 21 and the switch circuit 22, product-sum operation processing 23 (denoted by "×+" in the diagrams) is shown as a kind of operation processing. Moreover, addition processing 24 (denoted by "+" in the diagram) is shown as a kind of operation processing.

Figure 4A:
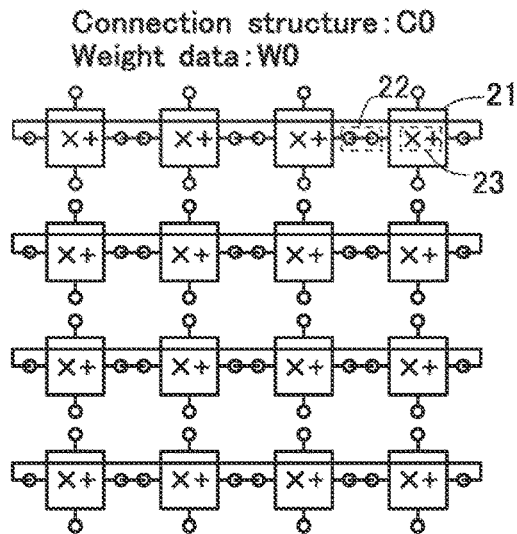
FIGS. 4A-4E Block diagrams for describing a semiconductor device.
Figure 4B:
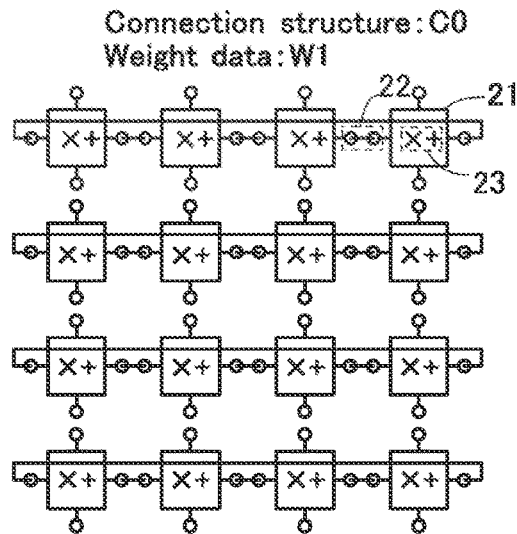
Figure 4C:
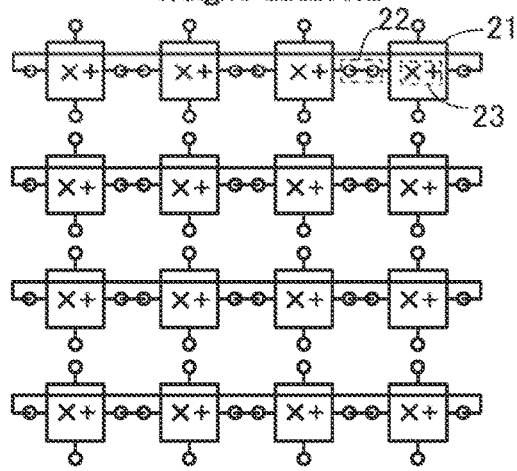
Figure 4D:
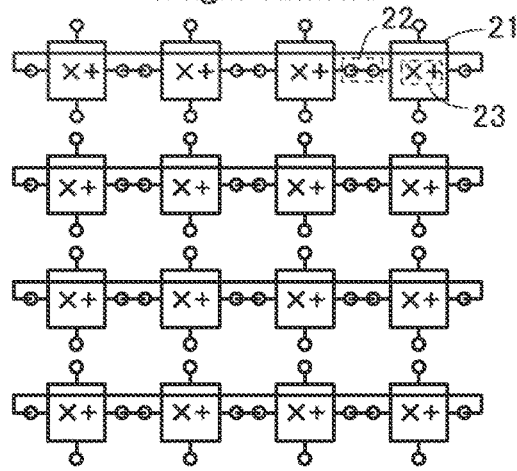

In FIGS. 4(A) to 4(D), product-sum operation processing is performed by fixing the connection structure by the switching signal context_C0 and switching the weight data by the switching signals context_W0 to W3. For example, in FIG. 4(A), the connection structure is set by the switching signal context_C0, the weight data is set to the weight data W0 by the switching signal context_W0, and product-sum operation processing in which addition data of a different operation circuit is added to multiplication data is performed. In FIG. 4(B), the connection structure is set by the switching signal context_C0, the weight data is set to the weight data W1 by the switching signal context_W1, and product-sum operation processing in which addition data of a different operation circuit is added to multiplication data is performed. In FIG. 4(C), the connection structure is set by the switching signal context_C0, the weight data is set to the weight data W2 by the switching signal context_W2, and product-sum operation processing in which addition data of a different operation circuit is added to multiplication data is performed. In FIG. 4(D), the connection structure is set by the switching signal context_C0, the weight data is set to the weight data W3 by the switching signal context_W3, and product-sum operation processing in which addition data of a different operation circuit is added to multiplication data is performed.

As in FIGS. 4(A) to 4(D), the multiplication data obtained by switching of the weight data W0 to W3 can be added to a value obtained by a different operation circuit and sequentially output to another operation circuit. Thus, it is possible to obtain product-sum operation data obtained by adding the multiplication data obtained by using the different weight data to each other. That is, the state in FIG. 3(F) can be obtained.

Figure 4E:
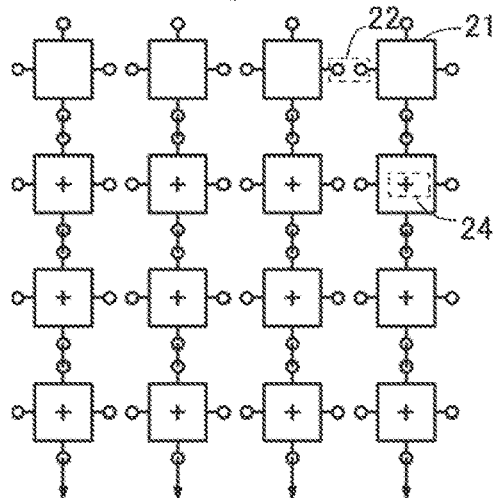

In FIG. 4(E), addition processing is performed by fixing the connection structure by the switching signal context_C1, and switching the weight data to the switching signal context_W0. The weight data is set to the weight data W0 by the switching signal context_W0 to perform addition processing in which the product-sum operation data obtained above are added to each other. With this structure, data corresponding to the sum of the product-sum operation data held in the operation circuits 21 can be obtained.

The connection structure is common to the above structures using the switching signal context_C0, and only the weight data are changed. With this structure, the number of contexts of the connection structure can be reduced. That is, the circuit area (a load of a signal line) can be reduced, leading to improvement in an operation speed and reduction in power consumption.

The structures in FIGS. 3(A) to 3(F) and FIGS. 4(A) to 4(E) are effective in a convolutional neural network in which product-sum operation processing is performed by switching weight data sequentially for input data having different forms.

In this specification, a neural network refers to a general model that is modeled on a biological neural network, determines the connection strength of neurons by learning, and has the capability of solving problems. A neural network includes an input layer, a middle layer (also referred to as a hidden layer), and an output layer. A neural network having two or more middle layers is referred to as a deep neural network (DNN). Learning by a deep neural network is referred to as deep learning. A circuit capable of executing a neural network by hardware is referred to as a neural network circuit.

In describing a neural network in this specification, to determine a connection strength of neurons (also referred to as a weight coefficient or a weight parameter) from existing information is sometimes referred to as learning.

Moreover, in this specification, to draw a new conclusion from a neural network formed using connection strengths obtained by learning is sometimes referred to as inference.

Figure 5:
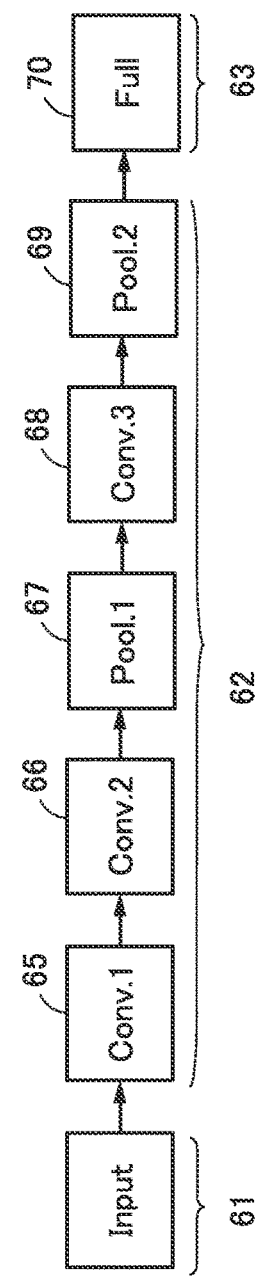
FIG. 5A block diagram for describing a semiconductor device.

FIG. 5 is a block diagram showing the flow of operation processing of a convolutional neural network. FIG. 5 illustrates an input layer 61, an intermediate layer 62 (also referred to as hidden layer), and an output layer 63. In the input layer 61, an input process (denoted by Input in the diagram) of input data is shown. In the intermediate layer 62, a convolution layer 65, a convolution layer 66, a convolution layer 68 (denoted by Conv. in the diagram), a pooling layer 67, and a pooling layer 69 (denoted by Pool. in the diagram) are shown. In the output layer 63, a fully-connected layer 70 (denoted by Full in the diagram) is shown. The layers in which the operation processing is performed in the input layer 61, the intermediate layer 62, and the output layer 63 are examples, and another operation processing such as a softmax operation may be performed in actual operation processing of a convolutional neural network.

In the convolution layer 65, the convolution layer 66, the convolution layer 68, and the fully-connected layer 70 illustrated in FIG. 5, product-sum operation processing of input data and weight data is performed. In operation processing in each layer, input data having different forms are input, and weight data are switched, and product-sum operation processing is performed. An increase in the number of contexts due to an increase in a data set of weight data causes an increase in circuit size. In the structure of one embodiment of the present invention, in the controller 12, a context signal is generated so that the number of contexts for switching the connection structure becomes smaller than the number of contexts for switching weight data. Therefore, a semiconductor device in which a reduction in sizes of a memory circuit for storing configuration data on the connection structure and a switch circuit is achieved can be obtained. In addition, when the circuit size is reduced, an increase in power consumption can be suppressed.

<Structure of Controller>

A structure example of the controller 12 included in the semiconductor device 10 is described.

Figure 6:
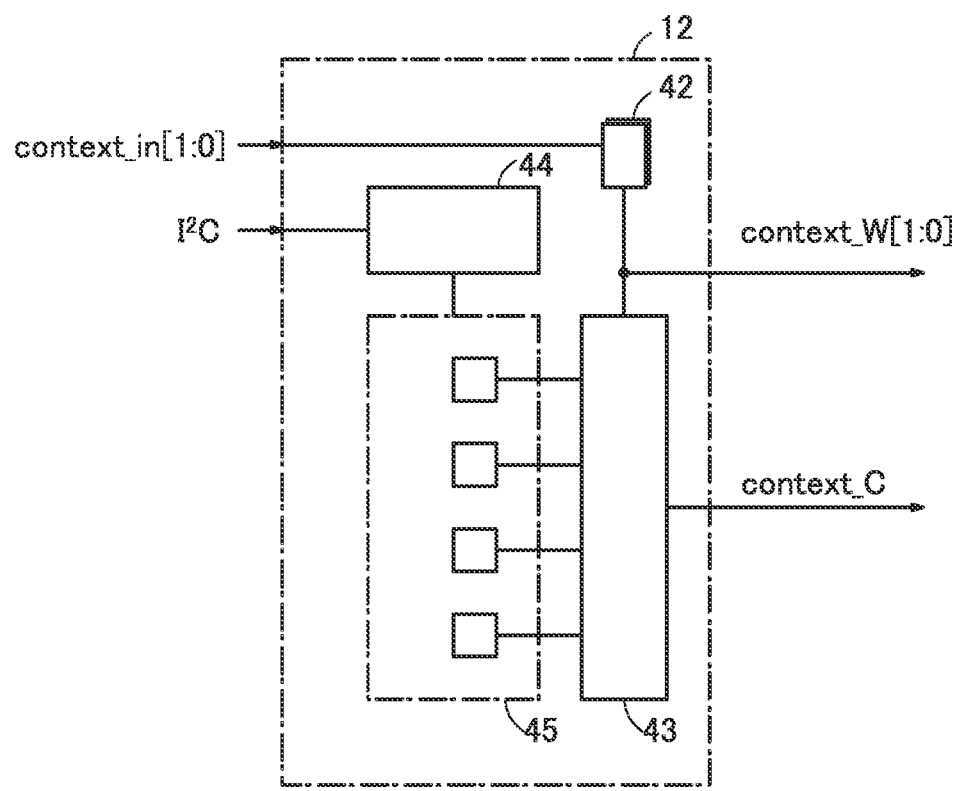
FIG. 6A block diagram for describing a semiconductor device.

FIG. 6 is a block diagram for describing a structure example of the controller 12. The controller 12 in FIG. 6 includes a flip-flop 42 and an I²C controller 44 in addition to a decoder 43 and a lookup table 45.

The controller 12 has a function of holding an input context signal context_in (denoted by context_in[1:0] in the diagram) in the flip-flop 42 and outputting it as a context signal context_W (denoted by context_W[1:0] in the diagram). The decoder 43 has a function of outputting the context signal context_C in response to an external signal through a serial bus such as I²C, referring to data stored in the lookup table 45.

Note that other than I²C, a bus standard such as the Universal Serial Bus or the Serial Peripheral Interface can be used.

As illustrated in FIG. 6, the controller 12 includes the lookup table 45. The lookup table 45 defines a correspondence relation between the numbers of contexts of the context signal context_W and the context signal context_C, which are different from each other. As a method for setting a parameter of the lookup table 45, for example, there is a method the context signal context_C is switched via the I²C controller 44 by I²C communication. Setting of the parameter of the lookup table 45 may be executed in configuration operation. When a parameter that can be controlled by a user by I²C communication can be defined, a variety of circuit structures can be achieved.

Next, the operation of the controller 12 is described.

Figure 7:
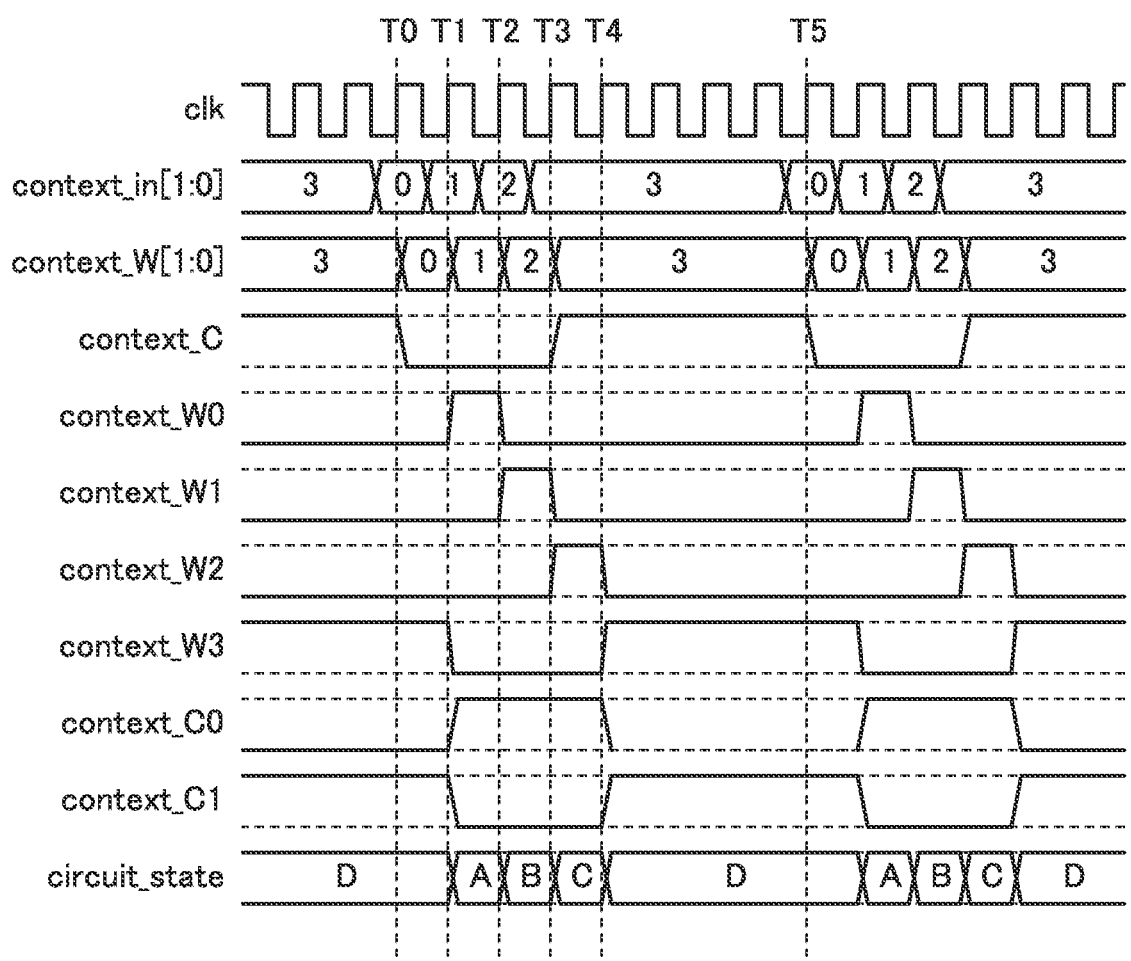
FIG. 7A timing chart for describing a semiconductor device.

FIG. 7 is a timing chart for describing the context signal context_in[1:0] and a circuit state of the product-sum operation circuit 11 in FIG. 1. The context signal context_in[1:0] by external input is a signal that is not synchronized with the clock signal clk.

In the description of FIG. 7, the context signal context_in [1:0] is a 2-bit signal, and four contexts, i.e., "3" to "0", can be represented. In the description of FIG. 7, the context signal context_W[1:0] is a 2-bit signal, and the context can be represented by four, "3" to "0". In the description of FIG. 7, the context signal context_C is a 1-bit signal, and the context can be represented by two signals, an H-level signal and an L-level signal.

At Time T0, the context is changed from "3" to "0" by the context signal context_W[1:0]. The context signal context_W[1:0] is decoded by the decoder 43 illustrated in FIG. 6. The context signal context_C is changed from "1" to "0" by setting of a parameter of the lookup table 45. As a result, at Time T1 when the next clock signal clk rises (changes from an L level to an H level), the switching signal context_W0 and the switching signal context_C0 become an H level. Furthermore, the switching signal context_W3 and the switching signal context_C1 become a L level, and the circuit structure circuit_state is changed from the state of the circuit D to the state of the circuit A.

At Time T1, the context is changed from "0" to "1" by the context signal context_W[1:0]. The context signal context_C is kept at "0" by setting of a parameter of the lookup table 45. As a result, at Time T2 when the next clock signal clk rises, the switching signal context_W1 becomes an H level. Furthermore, the switching signal context_W0 becomes an L level, and the circuit structure circuit_state is changed from the state of the circuit A to the state of the circuit B.

At Time T2, the context is changed from "1" to "2" by the context signal context_W[1:0]. The context signal context_C is kept at "0". As a result, at Time T3 when the next clock signal clk rises, the switching signal context_W2 becomes an H level. Furthermore, the switching signal context_W1 becomes an L level, and the circuit structure circuit_state is changed from the state of the circuit B to the state of the circuit C.

At Time T3, the context is changed from "2" to "3" by the context signal context_W[1:0]. The context signal context_C is changed from "0" to "1" by setting of a parameter of the lookup table 45. As a result, at Time T4 when the next clock signal clk rises, the switching signal context_W3 becomes an H level. Furthermore, the switching signal context_W2 becomes an L level, and the circuit structure circuit_state is changed from the state of the circuit C to the state of the circuit D.

As described above, the switching of the context is performed so that the number of contexts varies depending on objects such as the operation circuit 21 and the switch circuit. With this structure, a structure in which the context signal is not changed in the case where the circuit structure is not changed can be achieved. When the number of necessary contexts can be reduced, the switch circuits corresponding to the reduced contexts are unnecessary, leading to a reduction in the circuit area and an increase in the speed of the circuit operation.

<Structure of Operation Circuit>

An example of a structure of the operation circuit 21 included in the product-sum operation circuit 11 is described. As described with reference to FIGS. 2(A) to 2(E), the operation circuit 21 has a function of holding or outputting multiplication data obtained by multiplication of input data and weight data and a function of holding or outputting product-sum operation data obtained by adding the multiplication data and data (addition data) output from a different operation circuit.

Figure 8A:
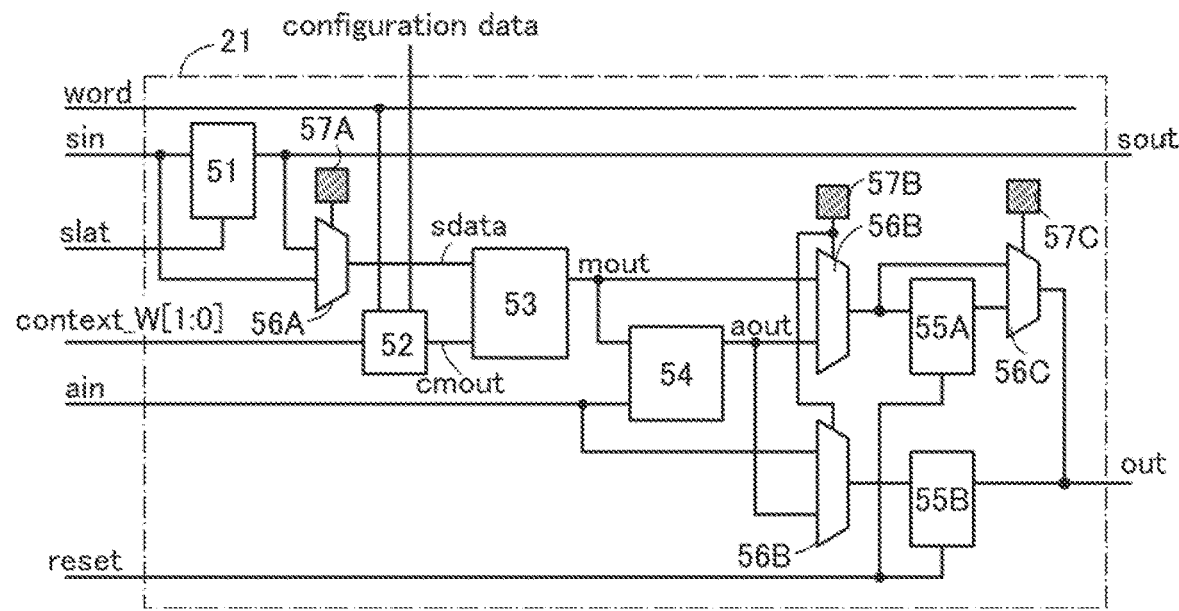
FIGS. 8A-8B Block diagrams for describing a semiconductor device.

FIG. 8(A) is a block diagram illustrating an example of the operation circuit 21. The operation circuit 21 includes, for example, an input register 51, a memory circuit 52, a multiplier circuit 53, an adder circuit 54, an output register 55A, an output register 55B, a switching circuit 56A, a memory element 57A, a switching circuit 56B, a memory element 57B, a switching circuit 56C, and a memory element 57C.

Data sin is input to the input register 51. The input register 51 holds the data sin by control by a latch signal slat. The input register 51 outputs data sout. The input register 51 outputs data sdata to the multiplier circuit 53 through the switching circuit 56A.

The switching circuit 56A is a circuit for controlling, as the data sdata input to the multiplier circuit 53, whether the data sin is output or whether data held in the input register 51 is output. The memory element 57A has a function of switching electrical connection in the switching circuit 56A in response to switching of the context signal context_C.

The context signal context_W[1:0] is input to the memory circuit 52. The memory circuit 52 includes a dataset corresponding to contexts. A dataset is data corresponding to a plurality of weight data used in product-sum operation processing. The memory circuit 52 outputs one weight data among the plurality of weight data corresponding to contexts, as weight data cmout in accordance with the context signal. The plurality of weight data stored in the memory circuit 52 are effective when operations are performed while a context is changed, for example, when the number of filters used in convolutional operation processing is large. Performing multiplication of different weight data and input data while a context is changed enables multiplication using one multiplier circuit under a variety of conditions.

A nonvolatile memory is used as the memory circuit 52. For the memory circuit 52, an OS memory using a transistor (an OS transistor) whose channel formation region contains an oxide semiconductor (OS) is useful. By providing the memory circuit 52 in each operation circuit 21, access to (read and write of) the above-described weight data is achieved at higher speed and lower power consumption than in the case of providing the memory circuit 52 outside the product-sum operation circuit 11. A structure example of the memory circuit 52 is described later.

The multiplier circuit 53 generates multiplication data mout corresponding to the product of the data sdata and the weight data cmout. The multiplication data mout is output to the adder circuit 54 and the switching circuit 56B.

The adder circuit 54 generates addition data aout corresponding to the sum obtained by adding the multiplication data mout to addition data ain. The addition data aout is output to the switching circuit 56B.

The switching circuit 56B is a circuit for controlling whether the multiplication data mout is output or whether the addition data aout is output. The switching circuit 56B is a circuit for controlling whether the addition data ain is output or whether the addition data aout is output. The memory element 57B has a function of switching electrical connection in the switching circuit 56B in response to switching of the context signal context_C.

The output register 55A and the output register 55B hold data selected in the switching circuit 56B and are reset by control by a reset signal reset. With the structure including the output register 55A and the output register 55B, it is possible to prevent an error of an operation result due to a signal delay.

The switching circuit 56B is a circuit for controlling whether data held in the output register 55A is output or whether data input to the output register 55A is output as output data out as it is. The memory element 57C has a function of switching electrical connection in the switching circuit 56C in response to switching of the context signal context_C.

Figure 8B:
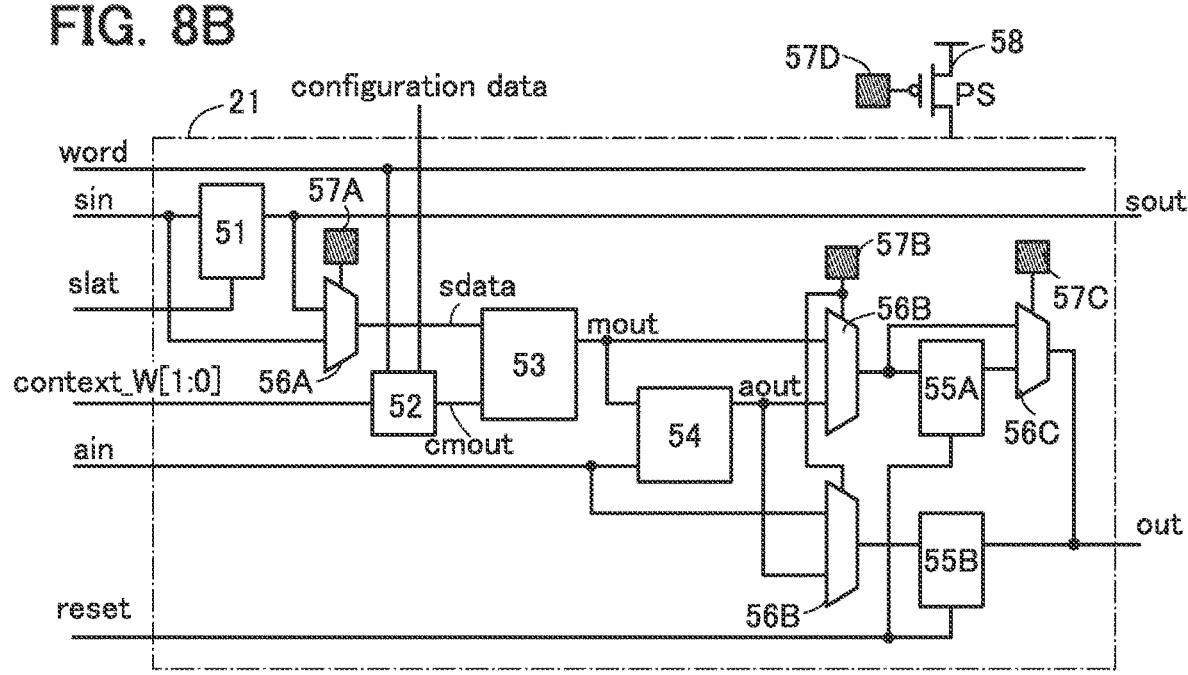

FIG. 8(B) is a block diagram of a modification example of the operation circuit 21 described with reference to FIG. 8(A). In the operation circuit 21 illustrated in FIG. 8(B), a power switch 58 and a memory element 57D are illustrated in addition to the components described with reference to FIG. 8(A). The memory element 57D can switch the on/off state of the power switch 58 in response to switching of the context signal context_C. With a structure in which the power switch 58 in the operation circuit 21 that is not used in operation processing can be turned off, power consumption due to current generated in standby operation can be reduced in unused operation circuits 21 among a large number of operation circuits 21.

Next, the structure of the memory circuit 52 included in the operation circuit 21 is described with reference to FIGS. 9(A) and 9(B). The memory circuit 52 has a function of holding weight data for each of a plurality of memory cells provided in accordance with the number of contexts and outputting the weight data cmout selected in response to a switching signal obtained by decoding the context signal context_W, to the multiplier circuit 53.

The memory circuit includes a flip-flop 71, a decoder 72, and a plurality of memory cells 73. The memory cell 73 includes transistors 74 to 76.

The flip-flop 71 has a function of holding the context signal context_W. The decoder 72 has a function of decoding the context signal context_W and outputting the switching signals context_W0 to context_W3. The memory cell 73 has a function of storing weight data (configuration data) and performing output in accordance with control by the switching signals context_W0 to context_W3.

One of a source and a drain of the transistor 74 is connected to a wiring for writing weight data. A gate of the transistor 74 is connected to a wiring through which a word signal word (denoted by words 1 to 4 in the diagram) is supplied. A gate of the transistor 75 is connected to the other of the source and the drain of the transistor 74. A node where the gate of the transistor 75 is connected to the other of the source and the drain of the transistor 74 is referred to as a node FN (denoted by FN0 to FN3 in the diagram). One of a source and a drain of the transistor 75 is connected to a fixed potential line (a ground line in the diagram). The other of the source and the drain of the transistor 75 is connected to one of a source and a drain of the transistor 76. A gate of the transistor 76 is connected to a wiring through which one of the switching signals context_W0 to context_W3 is supplied. The other of the source and the drain of the transistor 76 is connected to one of a source and a drain of the transistor 77 and an inverter latch 78. The other of the source and the drain of the transistor 77 is connected to a wiring through which a precharge voltage (Vpre in the diagram) is supplied. A gate of the transistor 77 is connected to a precharge control line (precharge in the diagram). The inverter l atch 78 is connected to a wiring through which the weight data cmout is supplied.

The transistor 74 is a transistor (OS transistor) including an oxide semiconductor in a channel formation region. The OS transistor has a low off-state current. Therefore, the transistor 74 is brought into a non-conduction state, whereby a potential held in the node FN can be held. The potential held in the node FN corresponds to data for 1-bit weight data. The potential held in the node FN can control a conduction state or a non-conduction state of the transistor 75. Therefore, when the transistor 76 is brought into a conduction state by the context signal W0, the potential of the wiring through which the weight data cmout corresponding to a potential held in the node FN is supplied can be switched.

Figure 9A:
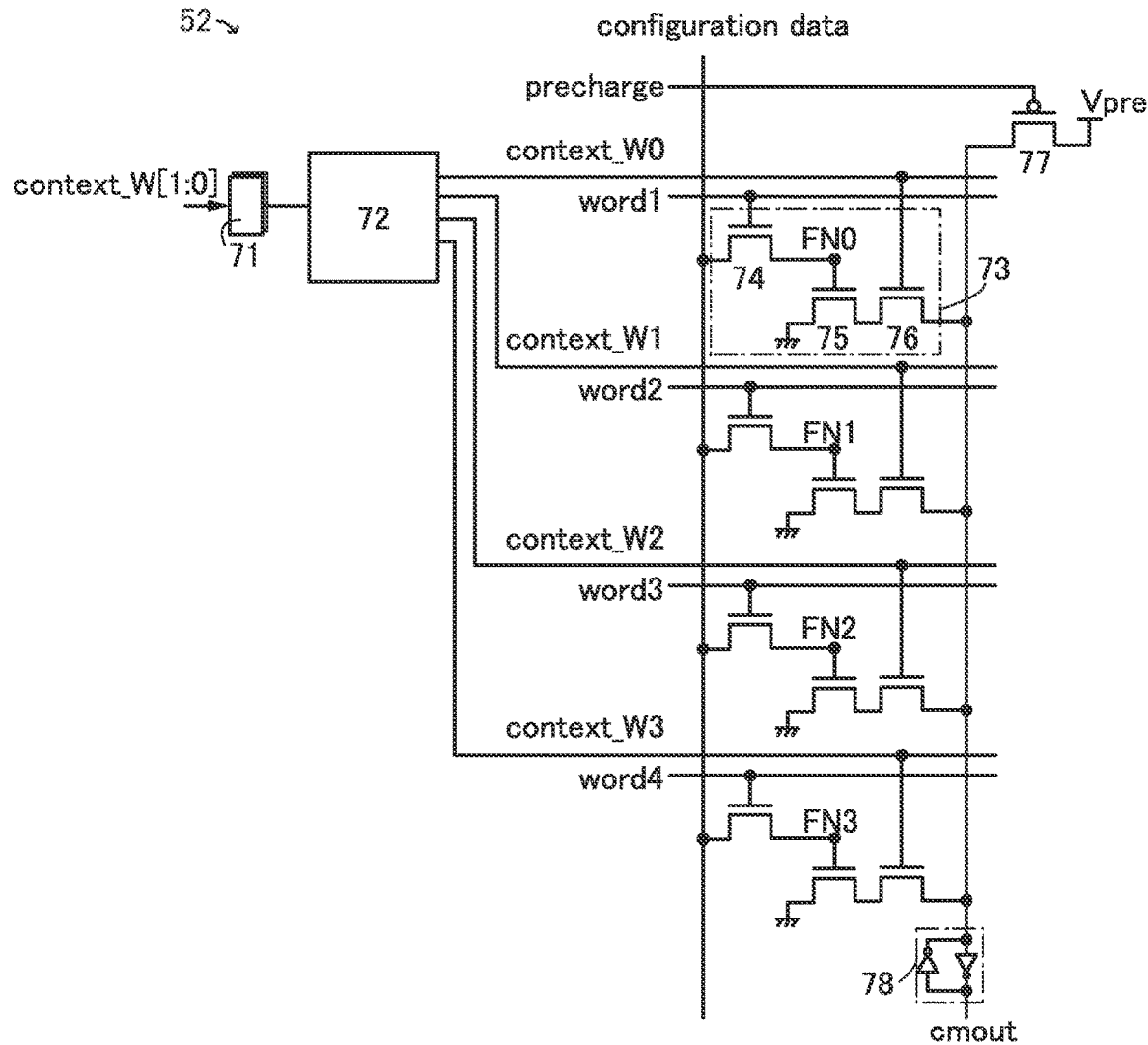
FIGS. 9A-9B Circuit diagrams for describing a semiconductor device circuit.
Figure 9B:
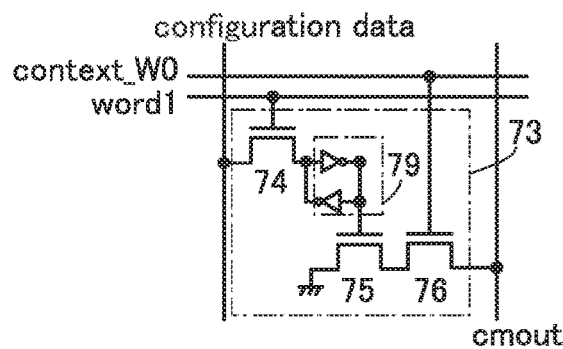

Note that in the case where an OS transistor is not used unlike in FIG. 9(A), a structure in FIG. 9(B) may be employed in which data corresponding to weight data is stored using an inverter latch 79.

In the semiconductor device 10 including the operation circuit 21 described in the above embodiment, the multiplier circuit and the adder circuit each including an Si transistor and the memory circuit including an OS transistor can be integrated into one die.

Figure 10A:
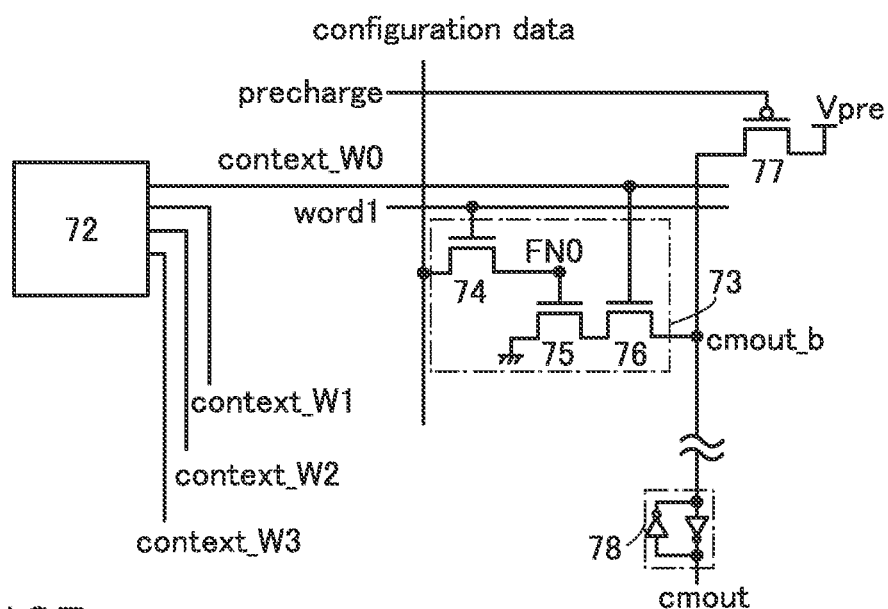
FIGS. 10A-10B A circuit diagram and timing charts for describing a semiconductor device circuit.
Figure 10B:
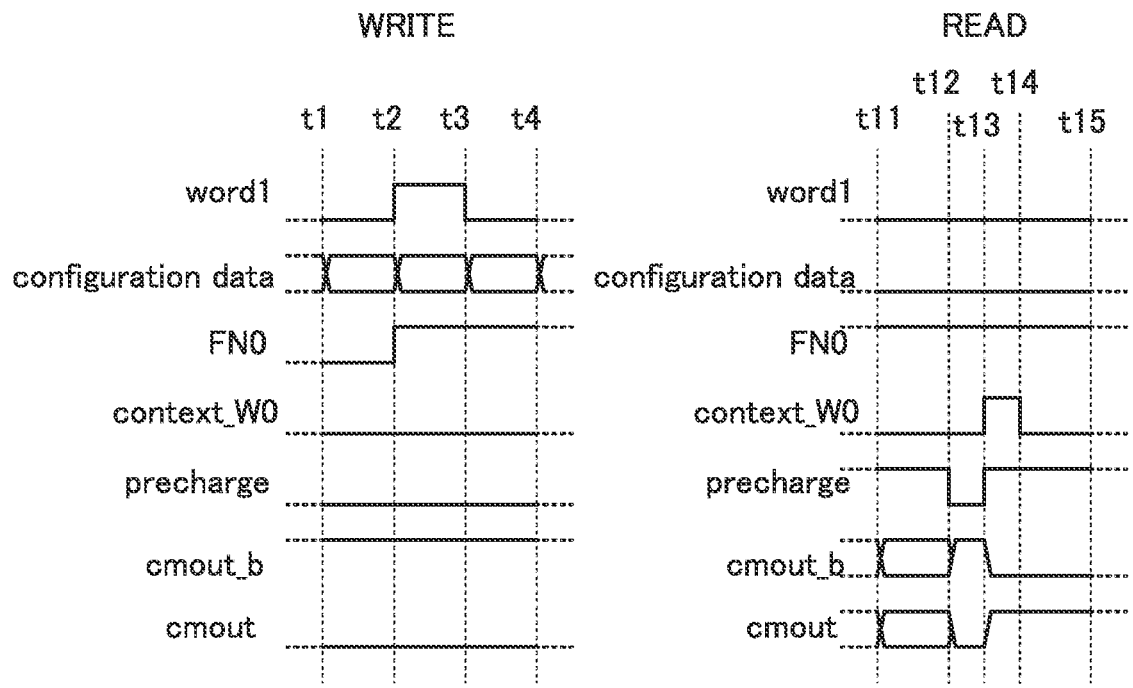

Furthermore, with reference to FIGS. 10(A) and 10(B), the operation of the memory circuit 52 illustrated in FIG. 9(A) is described. FIG. 10(A) is a circuit diagram illustrating extracted part of the circuit in FIG. 9(A). In FIG. 10(A), data of the wiring for reading the weight data cmout that is connected to the memory cell 73, the transistor 77, and the inverter latch 78 is shown as data cmout_b. The data of the wiring corresponds to a signal obtained by inversion of the logic of the weight data cmout.

Next, FIG. 10(B) shows timing charts for describing an operation example of the memory circuit 52 illustrated in FIG. 10(A).

In the timing charts shown in FIG. 10(B), change in the potentials of a word signal word 1 (hereinafter, abbreviated to word 1), a signal configuration data that corresponds to configuration data supplied to a bit line (hereinafter, abbreviated to configuration data), and the node FN0 (hereinafter, abbreviated to FN0); change in the potentials of the switching signal context_W0 (hereinafter, abbreviated to context_W0), and the precharge control line precharge (hereinafter, abbreviated to precharge); the data cmout_b (hereinafter, abbreviated to cmout_b); and the weight data cmout (hereinafter, abbreviated to cmout) are shown.

The operation of writing of the configuration data at Time t1 to t4 is described. First, at Time t2, the word 1 becomes an H level, and the configuration data is 1, and thus the FN0 becomes an H level. At this time, the precharge is at an L level, and thus the cmout_b becomes an H level, and the cmout_b becomes an L level.

At Time t3, the word 1 becomes an L level, and after that, the FN0 is fixed at an H level.

Next, the operation of reading of configuration data at Time t11 to t15 is described. At Time t12, the precharge becomes an L level. As a result, the cmout_b becomes an H level, and the cmout becomes an L level (precharge operation).

At Time t13, the precharge becomes an H level, and the context_W0 becomes an H level. The FN0 is kept at an H level. As a result, the cmout_b becomes an L level, and the cmout becomes an H level.

FIG. 10(B) shows the case where the data held in the node FN0 of the memory circuit 52 is 1 (H level). Note that in the case where the data is 0 (L level), even when the context_W0 becomes an H level at Time t12, the cmout_b is kept at an H level, and the cmout is kept at an L level.

The operation of the memory circuit 52 illustrated in FIG. 9(A) can be explained as described above.

Figure 11C:
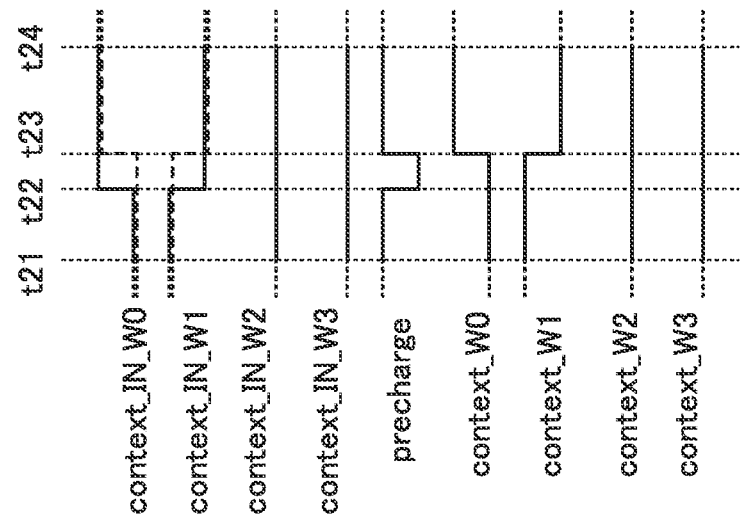
FIGS. 11A-11C Circuit diagrams and a timing chart for describing a semiconductor device circuit.
Figure 11A:
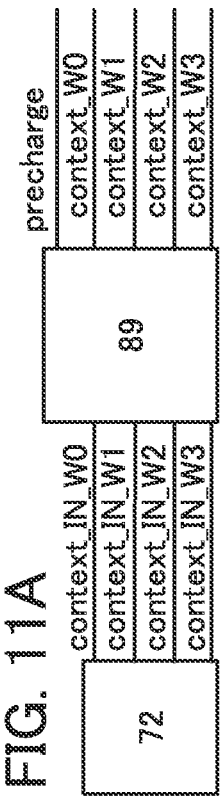
Figure 11B:
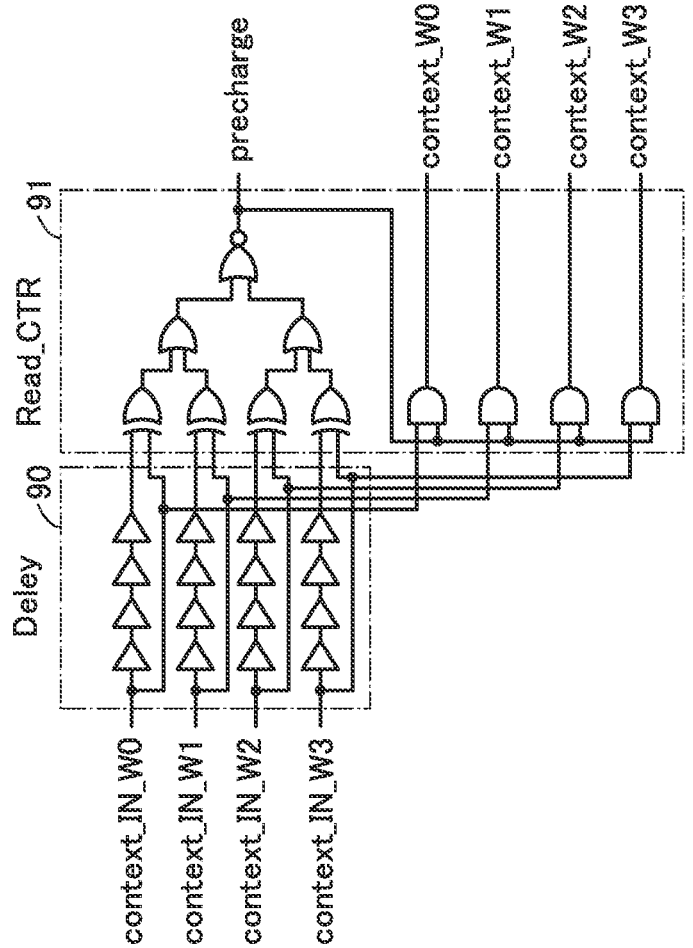

Next, with reference to FIGS. 11(A) to 11(C), a read control circuit 89 that can generate a signal to be supplied to the precharge control line precharge illustrated in FIG. 9(A) is described.

Note that the read control circuit 89 is a circuit for generating a signal to be supplied to the precharge control line precharge and the switching signals context_W0 to context_W3 to be supplied to the memory circuit 52, on the basis of input switching signals context_IN_W0 to context_IN_W3 generated by the decoder 72.

A structure example of the read control circuit 89 is described. The read control circuit 89 illustrated in FIG. 11(B) includes a delay circuit 90 (denoted by Delay in the diagram) and a control circuit 91 (denoted by Read_CTR in the diagram).

The delay circuit 90 includes a plurality of stages of delay circuits including buffers. Wirings through which the input switching signals context_IN_W0 to context_IN_W$_3$ are supplied are connected to the delay circuits. The delay circuit 90 has a function of delaying and outputting the input switching signals context_IN_W0 to context_IN_W$_3$.

The control circuit 91 has a function of generating a signal to be supplied to the precharge control line precharge and the switching signals context_W0 to context_W$_3$ to be supplied to the memory circuit 52, by using operation of the input switching signals context_IN_W0 to context_IN_W$_3$ and the delay signals.

With reference to a timing chart of FIG. 11(C), the operation of generating each signal in the read control circuit 89 illustrated in FIG. 11(B) is described. In FIG. 11(C), Time t21 to t24 are shown for explanation.

At Time t22, the input switching signal context_IN_W0 changes from an L level to an H level, and the input switching signal context_IN_W1 changes from an H level to an L level. As a result, a signal supplied to the precharge control line precharge changes from an H level to an L level.

At Time t23, the input switching signal context_IN_W0 changes from an L level to an H level because it is delayed by the delay circuit 90. In addition, the input switching signal context_IN_W1 changes from an H level to an L level because it is delayed by the delay circuit 90. As a result, a signal supplied to the precharge control line precharge changes from an L level to an H level. Moreover, the switching signal context_W0 changes from an L level to an H level, and the switching signal context_W1 changes from an H level to an L level.

Thus, the operation of the read control circuit 89 illustrated in FIG. 11(A) can be described.

Figure 12:
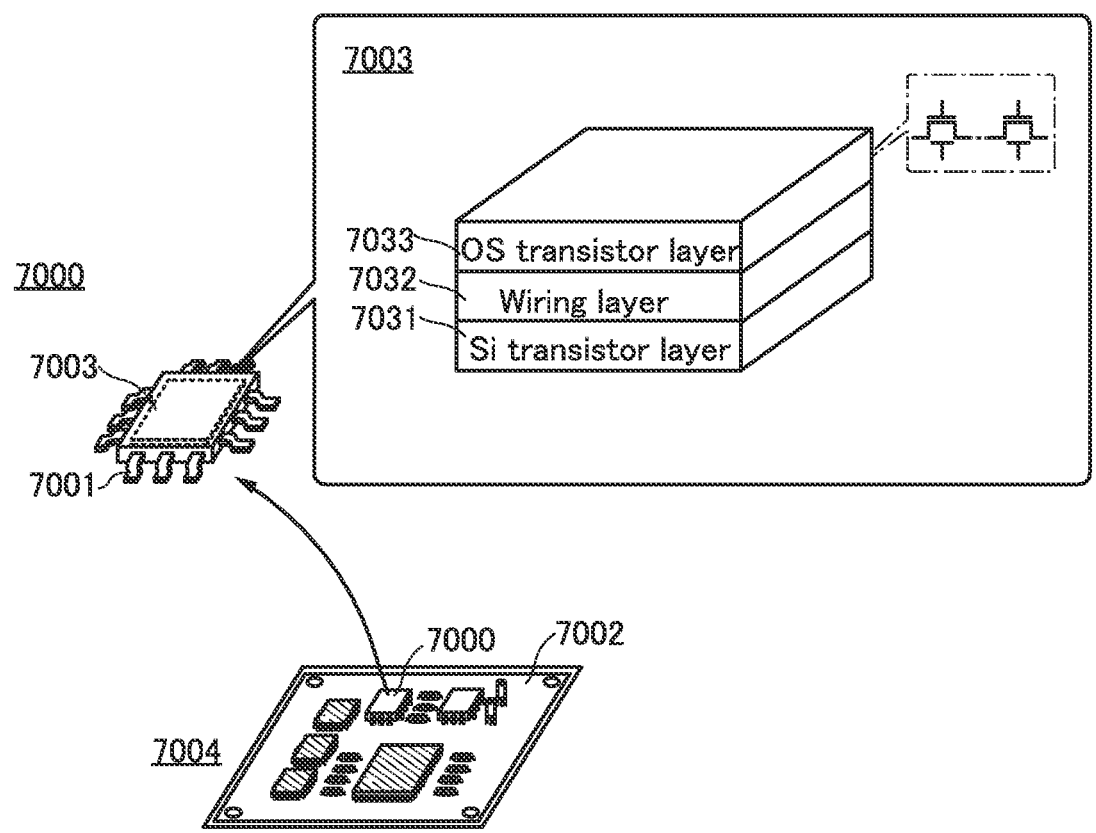
FIG. 12A schematic perspective diagram illustrating a structure example of an IC incorporating a semiconductor device.

FIG. 12 illustrates an example of an IC incorporating the semiconductor device. An IC 7000 illustrated in FIG. 12 includes a lead 7001 and a circuit portion 7003. In the circuit portion 7003, the various circuits described in the embodiment are provided on one die. The circuit portion 7003 has a stacked-layer structure, which is broadly divided into a Si transistor layer 7031, a wiring layer 7032, and an OS transistor layer 7033. Since the OS transistor layer 7033 can be provided to be stacked over the Si transistor layer 7031, the size of the IC 7000 can be easily reduced.

Although a QFP (Quad Flat Package) is used as a package of the IC 7000 in FIG. 12, the embodiment of the package is not limited thereto.

All the multiplier circuits and the adder circuits including Si transistors and the memory circuits including OS transistors can be formed in the Si transistor layer 7031, the wiring layer 7032, and the OS transistor layer 7033. In other words, elements included in the semiconductor device can be formed through the same manufacturing process. Thus, the number of steps in the manufacturing process of the IC illustrated in FIG. 12 does not need to be increased even when the number of elements is increased, and accordingly the semiconductor device can be incorporated into the IC at low cost.

<Structure of Switch Circuit>

The structure of the switch circuit 22 is described with reference to a semiconductor device 10A different from the semiconductor device 10 illustrated in FIG. 1.

Figure 13A:
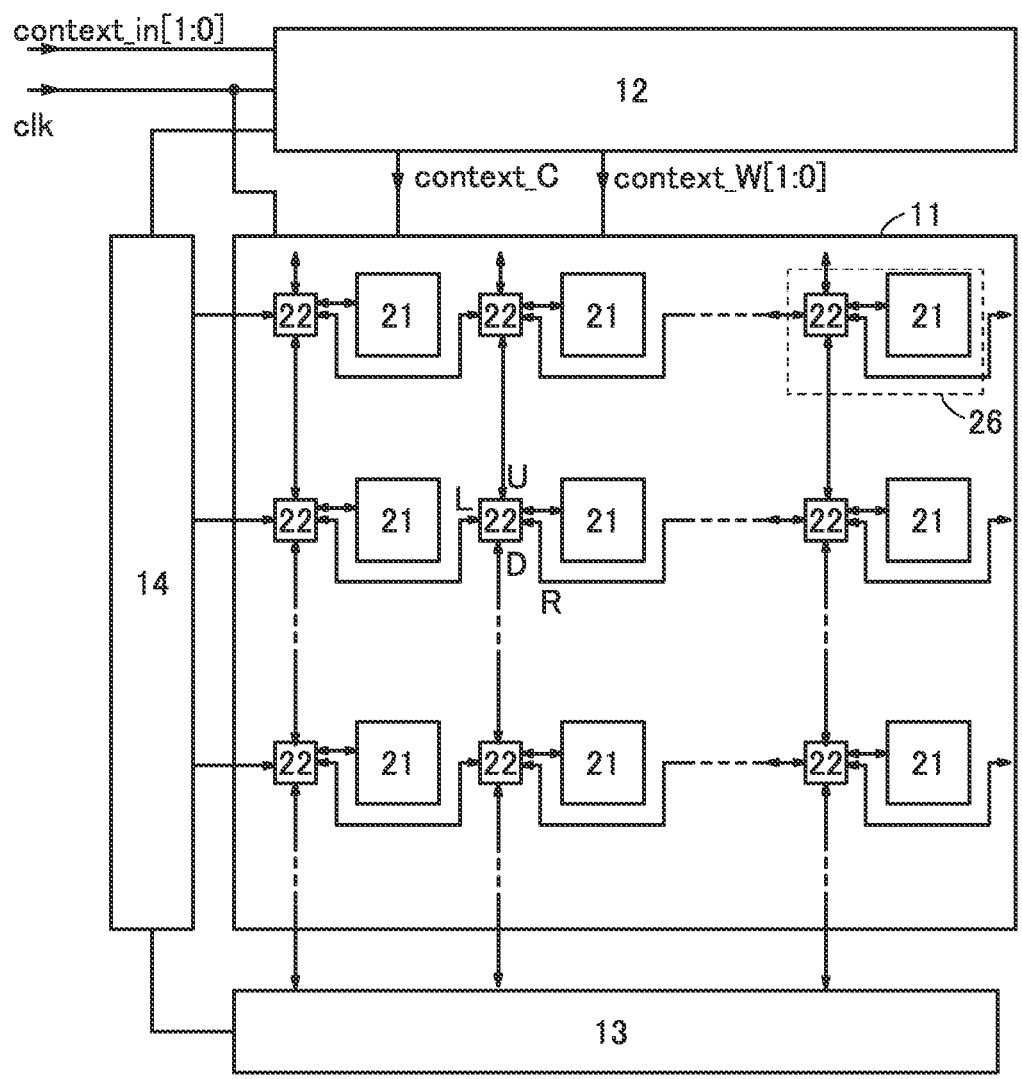
FIGS. 13A-13B Block diagrams for describing a semiconductor device.

FIG. 13(A) is a block diagram for describing the semiconductor device 10A. With the structure of the semiconductor device 10A illustrated in FIG. 13(A), the operation circuit 21 and the switch circuit 22 can be designed as a unit circuit in one area (a local area), which is preferable. The other structures are the same as those in FIG. 1.

The switch circuit 22 illustrated in FIG. 13(A) has a function of switching the connection state with the operation circuits 21 on the left, right, top, and bottom sides in order to switch the connection structure between the operation circuits 21. In FIG. 13(A), "U", "D", "L", and "R" represent wirings for electrically connecting to the operation circuits 21 in a "top" direction, a "bottom" direction, a "left" direction, and a "right" direction.

Figure 13B:
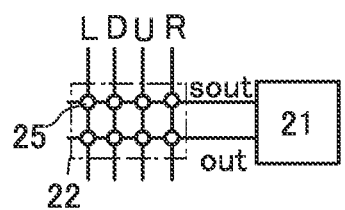

FIG. 13(B) is a diagram illustrating an example of the switch circuit 22. In the diagram, the data sout and the operation data out correspond to output data of the operation circuit 21 described with reference to FIGS. 8(A) and 8(B). The wiring through which the data sout and the operation data out are output is connected to any of wirings on the left, right, top, and bottom sides. A switch 25 for connecting wirings is provided at the intersection point. The switch 25 includes a memory circuit for storing configuration data on a connection structure.

Figure 14A:
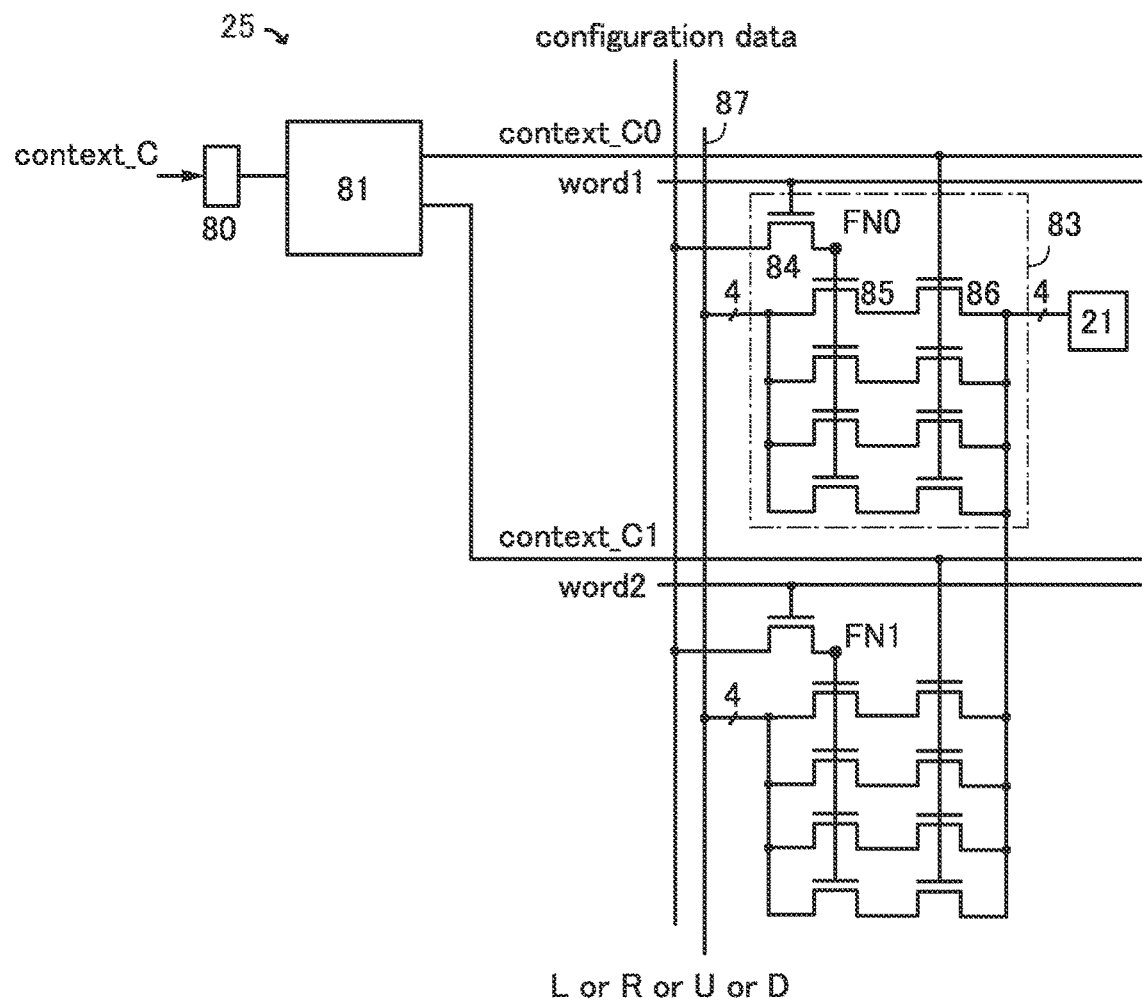
FIGS. 14A-14B Circuit diagrams for describing a semiconductor device.

The structure of the switch 25 including a memory circuit is described with reference to FIGS. 14(A) and 14(B). The memory circuit included in the switch 25 has a function of holding data corresponding to a connection structure for each of a plurality of memory cells provided in accordance with the number of contexts and switching connection between the wirings on the left, right, top, and bottom sides and the operation circuit 21 selected in accordance with the switching signal obtained by decoding the context signal context_C.

The switch 25 includes a flip-flop 80, a decoder 81, and a plurality of memory cells 83. The memory cell 83 includes transistors 84 to 86. Note that FIG. 14(A) illustrates a switch for transmitting 4-bit data as an example.

The flip-flop 80 has a function of holding the context signal context_C. The decoder 72 has a function of decoding the context signal context_C and outputting the switching signals context_C0 to context_C1. The memory cell 83 has a function of storing data corresponding to connection information and performing output in accordance with control by the switching signals context_C0 to context_C1.

One of a source and a drain of the transistor 84 is connected to a wiring for writing connection information (configuration data). A gate of the transistor 84 is connected to a wiring through which the word signal word (denoted by words 1 and 2 in the diagram) is supplied. A gate of the transistor 85 is connected to the other of the source and the drain of the transistor 84. A node where the gate of the transistor 85 and the other of the source and the drain of the transistor 84 are connected is referred to as a node FN (denoted by FN0 and FN1 in the diagram). One of a source and a drain of the transistor 85 is electrically connected to a wiring 87. The other of the source and the drain of the transistor 85 is connected to one of a source and a drain of the transistor 86. A gate of the transistor 86 is connected to a wiring for supplying one of the switching signal context_C0 or the switching signal context_C1. The other of the source and the drain of the transistor 86 is connected to a wiring to which data (out, sout) of the operation circuit 21 is output.

The transistor 84 is a transistor (an OS transistor) including an oxide semiconductor in a channel formation region. The off-state current of an OS transistor is low. Thus, a potential held in the node FN can be held by bringing the transistor 84 into a non-conduction state.

The potential held in the node FN can control a conduction state or a non-conduction state of the transistor 85. Thus, when the transistor 86 is brought into a conduction state by the switching signal context_C0, the potential of the data of the operation circuit 21 corresponding to the potential held in the node FN can be transmitted to the wiring 87.

Figure 14B:
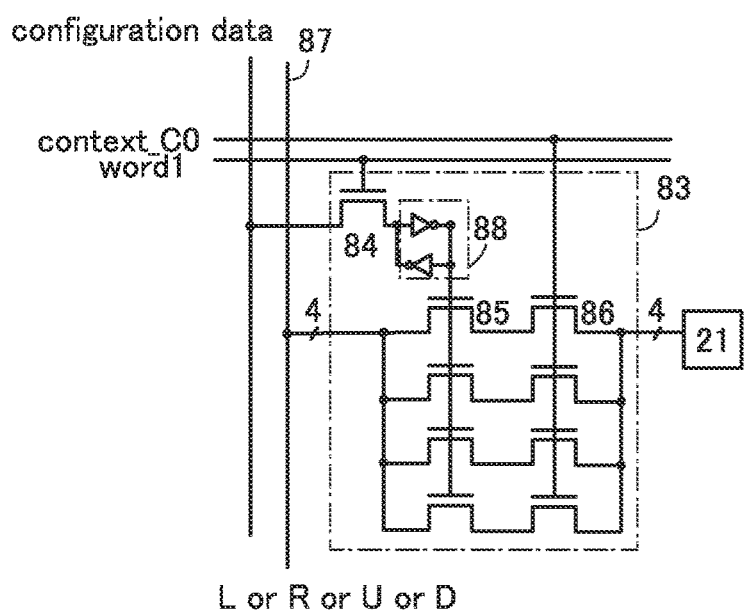

In the case where an OS transistor is not used, a structure in FIG. 14(B) may be employed in which data corresponding to weight data is stored using an inverter latch 88.

<Structure of Local Area>

A structure of a local area 26 illustrated in FIG. 13(A) is described with reference to FIG. 15.

Figure 15:
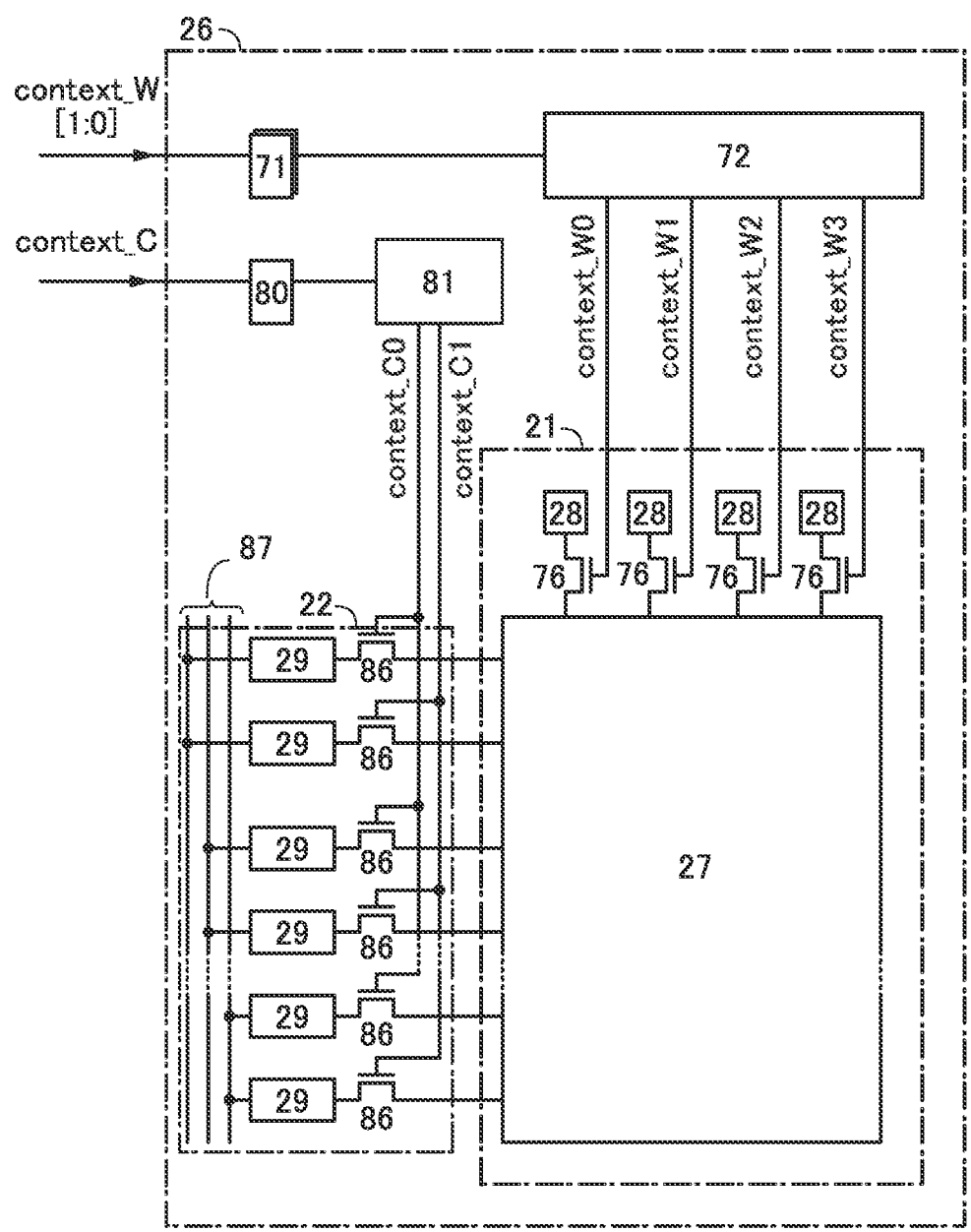
FIG. 15A block diagram for describing a semiconductor device.

As described above, the two context signals, the context signal context_W[1:0] and the context signal context_C are input from the controller 12 to the local area 26 illustrated in FIG. 15.

In the local area 26 illustrated in FIG. 15, the flip-flop 71 and the decoder 72 described above are illustrated. The decoder 72 decodes the context signal context_W[1:0] and outputs the switching signal context_W0 to the switching signal context_W3 to the operation circuit 21.

The operation circuit 21 includes a configuration memory 28, a transistor 76, and an operation portion 27. The configuration memory 28 is a memory including the transistor 74 and the transistor 75 illustrated in FIG. 9(A) and can hold charge corresponding to data in the node FN. The transistor 76 corresponds to the transistor 76 illustrated in FIG. 9(A). The operation portion 27 corresponds to the multiplier circuit 53 and the adder circuit 54 illustrated in FIGS. 8(A) and 8(B).

The switch circuit 22 includes a configuration memory 29, the transistor 86, and the wiring 87. The configuration memory 29 is a memory including the transistor 84 and the transistor 85 illustrated in FIG. 14(A) and can hold charge corresponding to data in the node FN. The transistor 86 corresponds to the transistor 86 illustrated in FIG. 14(A). The wiring 87 corresponds to the wiring 87 illustrated in FIG. 14(A).

Figure 16:
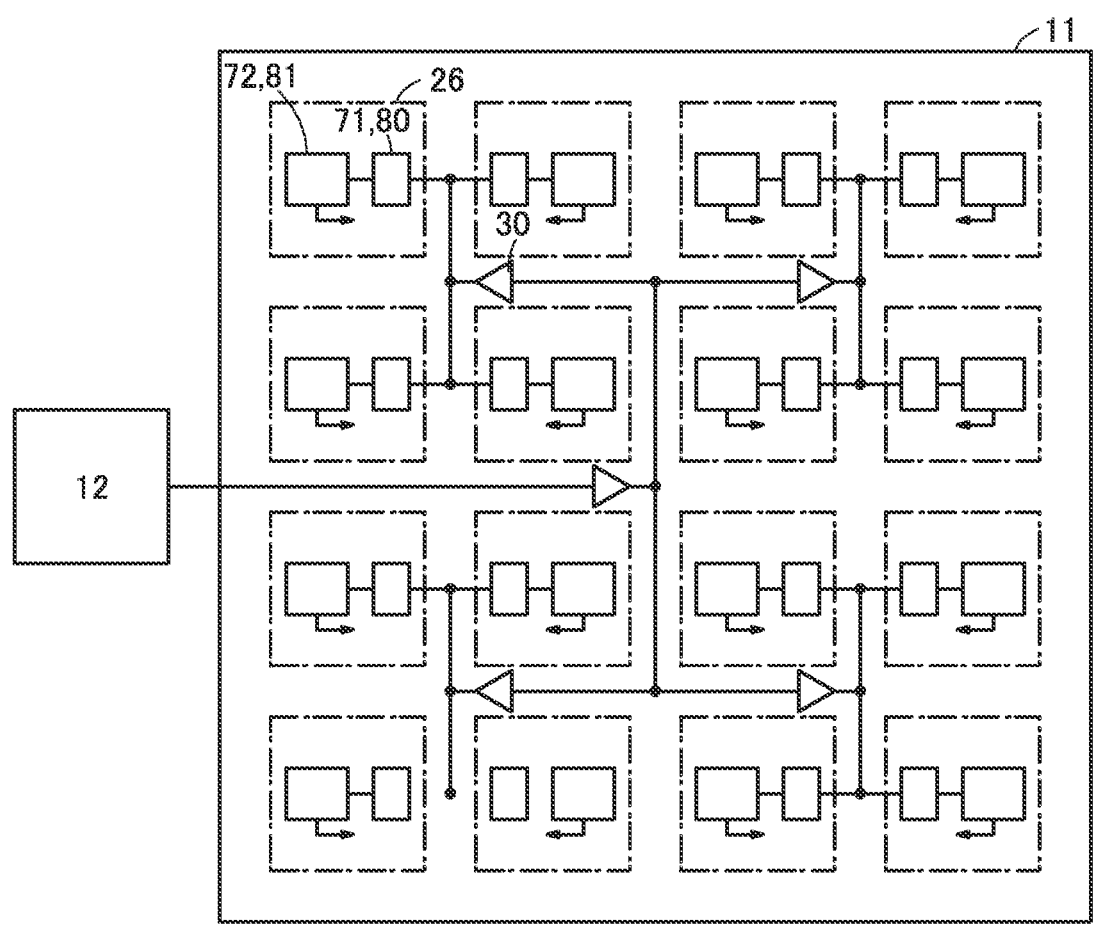
FIG. 16A block diagram for describing a semiconductor device.

FIG. 16 illustrates a structure for transmitting the context signal context_W and the context signal context_C from the controller 12 to a plurality of the local areas 26 included in the product-sum operation circuit 11. The product-sum operation circuit 11 has a structure in which wirings for transmitting the context signal context_W and the context signal context_C have a structure similar to that of a clock tree, and the signals are input to the flip-flops 71 and 80 included in the local area 26 in order to achieve high-speed switching of contexts.

Output signals of the flip-flops 71 and 80 are decoded by the decoders 72 and 81 and then supplied to the transistors 76 and 86 for selecting a context in the local area 26. The signals are supplied to the local area 26 that is a limited region; therefore, wiring delay and the like are reduced, and the transistors 76 and 86 can be controlled to be brought into a conduction state or a non-conduction state at high speed. In particular, when the number of contexts becomes large, the number of lines of signals to be supplied is increased because of a buffer tree; therefore, with the structure in which output signals of the flip-flops 71 and 80 in the local area 26 are decoded by the decoders 72 and 81, the number of the context signals can be reduced. With this structure, timing control in switching of a context becomes easy, and thus the operation can be stabilized even at a high operation frequency.

<Electronic Device>

Examples of an electronic device including the above semiconductor device are described with reference to FIG. 17.

Figure 17A:
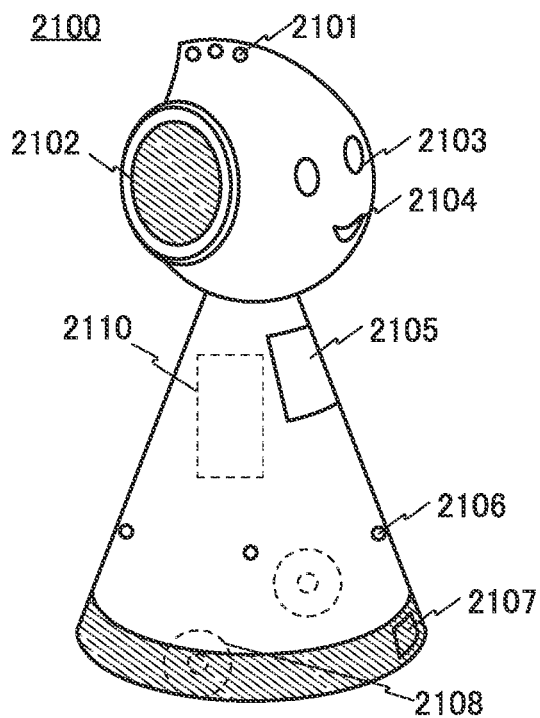
FIGS. 17A-17B Schematic diagrams illustrating examples of an electronic device.

A robot 2100 illustrated in FIG. 17(A) includes an operation device 2110, an illuminance sensor 2101, a microphone 2102, an upper camera 2103, a speaker 2104, a display 2105, a lower camera 2106, an obstacle sensor 2107, and a moving mechanism 2108.

The above semiconductor device can be used for the operation device 2110, the illuminance sensor 2101, the upper camera 2103, the display 2105, the lower camera 2106, the obstacle sensor 2107, and the like of the robot 2100.

The microphone 2102 has a function of detecting a speaking voice of a user, an environmental sound, and the like. The speaker 2104 also has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107.

Figure 17B:
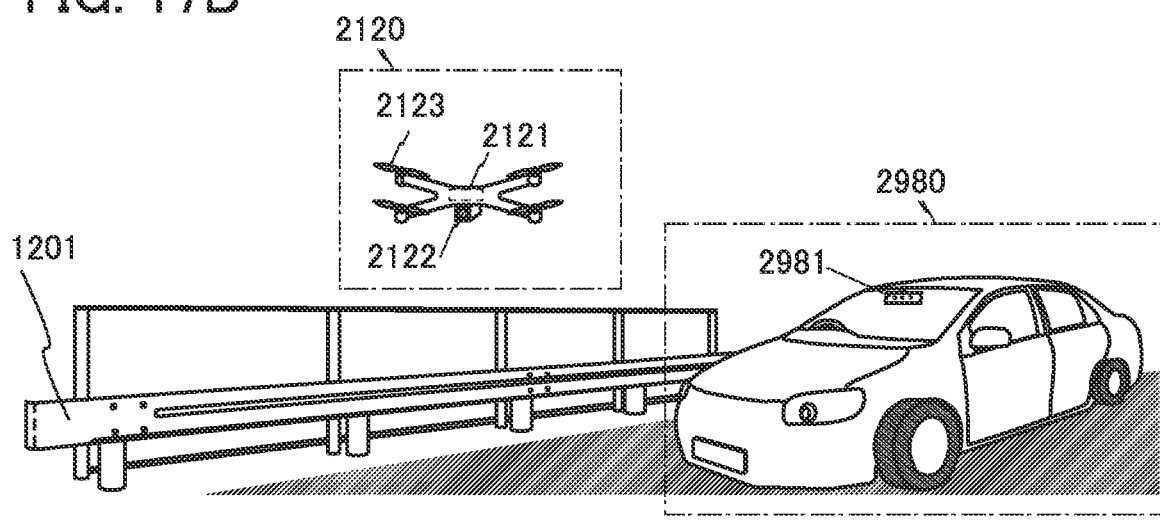

A flying object 2120 illustrated in FIG. 17(B) includes an operation device 2121, a propeller 2123, and a camera 2122 and has a function of flying autonomously.

The above semiconductor device can be used for the operation device 2121 and the camera 2122 of the flying object 2120.

FIG. 17(B) is an external view illustrating an example of a car. An automobile 2980 includes a camera 2981 and the like. The automobile 2980 also includes various sensors and the like such as an infrared radar, a millimeter wave radar, and a laser radar. The automobile 2980 judges traffic information therearound such as the presence of a guard rail 1201 or a pedestrian with analyzing an image taken by the camera 2981, and thus can perform automatic driving.

In the automobile 2980, the above semiconductor device can be used for the camera 2981.

<Notes on Description of this Specification and the Like>

The following are notes on the description of the structures in the above embodiments.

One embodiment of the present invention can be constituted by appropriately combining the structure described in an embodiment with any of the structures described in the other embodiments. In addition, in the case where a plurality of structure examples are described in one embodiment, the structure examples can be combined with each other as appropriate.

Note that a content (or part thereof) in an embodiment can be applied to, combined with, or replaced with another content in the same embodiment and/or a content (or part thereof) in another embodiment or other embodiments.

Note that in each embodiment, a content described in the embodiment is a content described with reference to a variety of diagrams or a content described with text disclosed in the specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be created.

In this specification and the like, components are classified on the basis of the functions and shown as blocks independent of each other in block diagrams. However, in an actual circuit or the like, it may be difficult to separate components on the basis of the functions, so that one circuit may be associated with a plurality of functions or several circuits may be associated with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In this specification and the like, the terms "one of a source and a drain" (or a first electrode or a first terminal) and "the other of the source and the drain" (or a second electrode or a second terminal) are used to describe the connection relation to a source and a drain of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Moreover, the term "electrode" or "wiring" also includes the case where a plurality of "electrodes" or "wirings" are formed in an integrated manner, for example.

In this specification and the like, voltage and potential can be interchanged with each other as appropriate. The term "voltage" refers to a potential difference from a reference potential. When the reference potential is a ground voltage, for example, "voltage" can be replaced with "potential". The ground potential does not necessarily mean 0 V. Potentials are relative values, and the potential applied to a wiring or the like is changed depending on the reference potential, in some cases.

Note that in this specification and the like, the terms such as "film" and "layer" can be interchanged with each other depending on the case or circumstances. For example, the term "conductive layer" can be changed into the term "conductive film" in some cases. For another example, the term "insulating film" can be changed into the term "insulating layer" in some cases.

In this specification and the like, a switch is in a conduction state (on state) or in a non-conduction state (off state) to determine whether current flows therethrough or not. Alternatively, a switch has a function of selecting and changing a current path.

Examples of a switch include an electrical switch and a mechanical switch. That is, any element can be used as a switch as long as it can control current, without limitation to a certain element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined.

Note that in the case of using a transistor as a switch, a "conduction state" of the transistor refers to a state where a source and a drain of the transistor can be regarded as being electrically short-circuited. Furthermore, a "non-conduction state" of the transistor refers to a state where the source and the drain of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology, such as a digital micromirror device (DMD). Such a switch includes an electrode that can be moved mechanically, and operates by controlling conduction and non-conduction in accordance with movement of the electrode.

In this specification and the like, the channel length refers to, for example, the distance between a source and a drain in a region where a semiconductor (or a portion where current flows in a semiconductor when a transistor is on) and a gate overlap each other, or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate electrode overlap each other, or a region where a channel is formed.

In this specification and the like, the expression "A and B are connected" means the case where A and B are electrically connected as well as the case where A and B are directly connected. Here, the expression "A and B are electrically connected" means the case where electric signals can be transmitted and received between A and B when an object having any electric action exists between A and B.

REFERENCE NUMERALS

10: semiconductor device, 10A: semiconductor device, 11: product-sum operation circuit, 12: controller, 13: data processing circuit, 14: SRAM, T0: time, T1: time, T2: time, T3: time, T4: time, W0: weight data, W1: weight data, W2: weight data, W3: weight data, 21: operation circuit, 21A: operation circuit, 21B: operation circuit, 22: switch circuit, 31: input data, 32_1 to 32_4: weight data, 33_1 to 33_4: product-sum operation data, 23: product-sum operation processing, 24: sum operation processing, 61: input layer, 62: intermediate layer, 63: output layer, 65: convolution layer, 66: convolution layer, 67: pooling layer, 68: convolution layer, 69: pooling layer, 70: fully-connected layer, 42: flip-flop, 43: decoder, 44: I$^2$C controller, 45: lookup table, 51: input register, 56A-56C: switching circuit, 57A-57D: memory element, 52: memory circuit, 53: multiplier circuit, 54: adder circuit, 55A-55B: output register, 58: power switch, 71: flip-flop, 72: decoder, 73: memory cell, 74: transistor, 75: transistor, 76: transistor, 77: transistor, 78: inverter latch, 7000: IC, 7001: lead, 7003: circuit portion, 7031: Si transistor layer, 7032: wiring layer, 7033: OS transistor layer, 26: local area, 25: switch, 27: operation portion, 80: flip-flop, 81: decoder, 83: memory cell, 84: transistor, 85: transistor, 86: transistor, 87: wiring, 89: read control circuit, 90: delay circuit, 91: control circuit, 28: configuration memory, 29: configuration memory, 1201: guard rail, 2100: robot, 2101: illuminance sensor, 2102: microphone, 2103: upper camera, 2104: speaker, 2105: display, 2106: lower camera, 2107: obstacle sensor, 2108: moving mechanism, 2110: operation device, 2120: flying object, 2121: operation device, 2122: camera, 2123: propeller, 2980: automobile, 2981: camera

The invention claimed is:

1. A semiconductor device comprising:
   operation circuits; and
   a switch circuit,
   wherein each of the operation circuits comprises:
      a memory circuit configured to store a plurality of weight data; and
      a multiplier circuit configured to perform an operation based on an input data and one of the plurality of weight data selected by a first context signal,
   wherein the memory circuit is formed in a first layer,
   wherein the multiplier circuit is formed in a second layer,
   wherein the switch circuit is configured to switch an electrical connection state between the operation circuits in accordance with a second context signal, and
   wherein a number of second contexts switched on the basis of the second context signal is smaller than a number of first contexts switched on the basis of the first context signal.

2. The semiconductor device according to claim 1, wherein the memory circuit comprises a transistor including an oxide semiconductor in a channel formation region.

3. An integrated circuit comprising:
   a circuit portion comprising the semiconductor device according to claim 1; and a lead.

4. A semiconductor device comprising:
   a controller;
   operation circuits; and
   a switch circuit,
   wherein each of the operation circuits comprises:
      a memory circuit configured to store a plurality of weight data; and
      a multiplier circuit configured to perform an operation based on an input data and one of the plurality of weight data selected by a first context signal,
   wherein the memory circuit is formed in a first layer,
   wherein the multiplier circuit is formed in a second layer,
   wherein the switch circuit is configured to switch an electrical connection state between the operation circuits in accordance with a second context signal,
   wherein the controller is configured to generate the first context signal and the second context signal on the basis of a third context signal, and
   wherein a number of second contexts switched on the basis of the second context signal is smaller than a number of first contexts switched on the basis of the first context signal.

5. The semiconductor device according to claim 4, wherein the memory circuit comprises a transistor including an oxide semiconductor in a channel formation region.

6. An integrated circuit comprising:
   a circuit portion comprising the semiconductor device according to claim 4; and a lead.

* * * * *